(12) United States Patent
Sasaki et al.

(10) Patent No.: US 10,950,815 B2
(45) Date of Patent: *Mar. 16, 2021

(54) LIGHT-EMITTING ELEMENT COMPRISING STACKED LIGHT-EMITTING LAYERS, LIGHT-EMITTING DEVICE, ELECTRONIC DEVICE, AND LIGHTING DEVICE

(71) Applicant: Semiconductor Energy Laboratory Co., Ltd., Kanagawa-ken (JP)

(72) Inventors: Toshiki Sasaki, Kanagawa (JP); Shogo Uesaka, Kanagawa (JP); Satoshi Seo, Kanagawa (JP)

(73) Assignee: Semiconductor Energy Laboratory Co., Ltd.

(*) Notice: Subject to any disclaimer, the term of this patent is extended or adjusted under 35 U.S.C. 154(b) by 0 days.

This patent is subject to a terminal disclaimer.

(21) Appl. No.: 16/738,335

(22) Filed: Jan. 9, 2020

(65) Prior Publication Data

US 2020/0152903 A1    May 14, 2020

Related U.S. Application Data

(63) Continuation of application No. 14/623,928, filed on Feb. 17, 2015, now Pat. No. 10,535,830.

(30) Foreign Application Priority Data

Feb. 21, 2014    (JP) .................................. 2014-031792

(51) Int. Cl.
   *H01L 51/50* (2006.01)
   *H01L 51/52* (2006.01)
   *H01L 51/00* (2006.01)

(52) U.S. Cl.
   CPC ...... *H01L 51/5028* (2013.01); *H01L 51/5016* (2013.01); *H01L 51/5278* (2013.01);
   (Continued)

(58) Field of Classification Search
   CPC combination set(s) only.
   See application file for complete search history.

(56) References Cited

U.S. PATENT DOCUMENTS 7,906,226 B2    3/2011    Matsuura et al.
8,105,701 B2    1/2012    Matsuura et al.
(Continued)

FOREIGN PATENT DOCUMENTS

CN    102484923 A    5/2012
CN    102668157 A    9/2012
(Continued)

OTHER PUBLICATIONS

International Search Report re Application No. PCT/IB2015/050977, dated Jun. 2, 2015.
(Continued)

*Primary Examiner* — Nduka E Ojeh
(74) *Attorney, Agent, or Firm* — Husch Blackwell LLP

(57) ABSTRACT

A light-emitting element with a high current efficiency is provided. A low-power consumption light-emitting device is also provided. In addition, low-power consumption electronic device and lighting device are provided. The light-emitting element includes an EL layer between a pair of electrodes. The EL layer includes a light-emitting layer. The light-emitting layer includes a first light-emitting layer and a second light-emitting layer. The emission peak of the second light-emitting layer is at a shorter wavelength than that of the first light-emitting layer. The first light-emitting layer includes a host material and a guest material. The LUMO level of the guest material is in the range of ±0.1 eV of the LUMO level of the host material.

24 Claims, 8 Drawing Sheets

(52) U.S. Cl.
CPC ........ *H01L 51/006* (2013.01); *H01L 51/0052* (2013.01); *H01L 51/0061* (2013.01); *H01L 51/0072* (2013.01); *H01L 51/0074* (2013.01); *H01L 51/0085* (2013.01); *H01L 51/5004* (2013.01); *H01L 51/5044* (2013.01); *H01L 51/5265* (2013.01); *H01L 2251/5384* (2013.01); *H01L 2251/552* (2013.01)

(56) References Cited

U.S. PATENT DOCUMENTS

| | | | |
|---|---|---|---|
| 8,470,455 | B2 | 6/2013 | Matsuura et al. |
| 8,841,655 | B2 | 9/2014 | Okamoto |
| 8,877,351 | B2 | 11/2014 | Inoue et al. |
| 9,153,627 | B2 | 10/2015 | Ohsawa et al. |
| 9,663,711 | B2 | 5/2017 | Takeda et al. |
| 9,673,264 | B2 | 6/2017 | Ohsawa et al. |
| 9,929,350 | B2 | 3/2018 | Yamazaki et al. |
| 10,153,332 | B2 | 12/2018 | Ohsawa et al. |
| 2009/0322217 | A1* | 12/2009 | Inoue .............. C07F 15/0033 313/504 |
| 2010/0301317 | A1 | 12/2010 | Nowatari et al. |
| 2011/0057178 | A1* | 3/2011 | Shitagaki ............ H01L 51/5012 257/40 |
| 2012/0205676 | A1 | 8/2012 | Seo et al. |
| 2012/0205685 | A1 | 8/2012 | Seo et al. |
| 2012/0205686 | A1* | 8/2012 | Seo .................... H01L 27/15 257/89 |
| 2012/0205687 | A1* | 8/2012 | Yamazaki ........... H01L 51/5016 257/89 |
| 2012/0223346 | A1* | 9/2012 | Ohsawa ............. H01L 27/3206 257/89 |
| 2012/0274201 | A1 | 11/2012 | Seo et al. |
| 2012/0305898 | A1* | 12/2012 | Okamoto ............ H01L 51/5016 257/40 |
| 2013/0087773 | A1 | 4/2013 | Suzuki et al. |
| 2013/0206218 | A1 | 8/2013 | Holmes et al. |
| 2013/0207088 | A1 | 8/2013 | Seo |
| 2013/0306945 | A1 | 11/2013 | Seo |
| 2014/0034926 | A1 | 2/2014 | Matsubara et al. |
| 2014/0034927 | A1 | 2/2014 | Seo et al. |
| 2014/0034930 | A1 | 2/2014 | Seo et al. |
| 2014/0034931 | A1 | 2/2014 | Inoue et al. |
| 2014/0034932 | A1 | 2/2014 | Seo et al. |
| 2014/0191220 | A1 | 7/2014 | Watabe et al. |
| 2014/0264308 | A1 | 9/2014 | Yamazaki et al. |
| 2014/0291642 | A1 | 10/2014 | Watabe et al. |
| 2015/0001502 | A1 | 1/2015 | Seo et al. |
| 2015/0102331 | A1 | 4/2015 | Seo et al. |
| 2017/0253796 | A1 | 9/2017 | Takeda et al. |
| 2018/0212154 | A1 | 7/2018 | Yamazaki et al. |

FOREIGN PATENT DOCUMENTS

| | | |
|---|---|---|
| JP | 2010-030996 A | 2/2010 |
| JP | 2010-182699 A | 8/2010 |
| JP | 2011-077032 A | 4/2011 |
| JP | 2012-199231 A | 10/2012 |
| JP | 2013-048194 A | 3/2013 |
| JP | 2013-102146 A | 5/2013 |
| KR | 2012-0073271 A | 7/2012 |
| KR | 2013-0039298 A | 4/2013 |
| TW | 201125165 | 7/2011 |
| TW | 201242132 | 10/2012 |
| TW | 201311650 | 3/2013 |
| WO | WO 2009/157498 A1 | 12/2009 |
| WO | WO 2011/027653 A1 | 3/2011 |
| WO | WO 2011/132550 A1 | 10/2011 |
| WO | WO 2013/027846 A1 | 2/2013 |

OTHER PUBLICATIONS

Written opiniont re Application No. PCT/IB2015/050977, dated Jun. 2, 2015.

Chinese Office Action re Application No. CN 201580009454.8, dated Sep. 7, 2018.

Taiwanese Office Action re Application No. Tw 104104433, dated Nov. 12, 2018.

* cited by examiner

LIGHT-EMITTING ELEMENT COMPRISING STACKED LIGHT-EMITTING LAYERS, LIGHT-EMITTING DEVICE, ELECTRONIC DEVICE, AND LIGHTING DEVICE

This application is a continuation of copending U.S. application Ser. No. 14/623,928, filed on Feb. 17, 2015 which is incorporated herein by reference.

TECHNICAL FIELD

One embodiment of the present invention relates to a light-emitting element in which an organic compound capable of emitting light by application of an electric field is provided between a pair of electrodes, and also relates to a light-emitting device, an electronic device, and a lighting device including such a light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

BACKGROUND ART

A light-emitting element using an organic compound as a luminous body, which has features such as thinness, lightness, high-speed response, and DC drive at low voltage, is expected to be used in a next-generation flat panel display. In particular, a display device in which light-emitting elements are arranged in matrix is considered to have advantages in a wide viewing angle and excellent visibility over a conventional liquid crystal display device.

The light emission mechanism is said to be as follows: when a voltage is applied between a pair of electrodes with an EL layer including a luminous body provided therebetween, electrons injected from the cathode and holes injected from the anode recombine in the light emission center of the EL layer to form molecular excitons, and energy is released and light is emitted when the molecular excitons return to the ground state. Singlet excitation and triplet excitation are known as excited states, and it is thought that light emission can be achieved through either of the excited states.

In order to improve the element characteristics of such light-emitting elements, improvement of an element structure, development of materials, and the like have been actively carried out (for example, see Patent Document 1).

REFERENCE

Patent Document

[Patent Document 1] Japanese Published Patent Application No. 2010-182699

DISCLOSURE OF INVENTION

The current efficiency of a light-emitting element is one of the important evaluation factors in development. Higher current efficiency reduces power consumption, promising to enable mass production. A light-emitting element with a high current efficiency therefore needs to be developed.

One embodiment of the present invention provides a light-emitting element with a high current efficiency. Another embodiment of the present invention provides a low-power consumption light-emitting device including the light-emitting element. Another embodiment of the present invention provides low-power consumption electronic device and lighting device. Another embodiment of the present invention provides a novel light-emitting element, a novel light-emitting device, a novel lighting device, and the like. Note that the description of these objects does not disturb the existence of other objects. Note that in one embodiment of the present invention, there is no need to achieve all the objects. Note that other objects will be apparent from the description of the specification, the drawings, the claims, and the like and other objects can be derived from the description of the specification, the drawings, the claims, and the like.

One embodiment of the present invention is a light-emitting element including an EL layer between a pair of electrodes (an anode and a cathode). The EL layer includes a light-emitting layer. The light-emitting layer includes a first light-emitting layer and a second light-emitting layer. The first light-emitting layer is provided between the cathode and the second light-emitting layer. The second light-emitting layer is provided between the first light-emitting layer and the anode. The first light-emitting layer includes a region in contact with the second light-emitting layer. The emission peak of the second light-emitting layer is at a shorter wavelength than that of the first light-emitting layer. The first light-emitting layer includes a host material and a guest material. The LUMO (Lowest Unoccupied Molecular Orbital) level of the guest material is in the range of ±0.1 eV of the LUMO level of the host material.

Another embodiment of the present invention is a light-emitting element including a first EL layer, a second EL layer, and a charge-generation layer. The first EL layer, the second EL layer, and the charge-generation layer are provided between a cathode and an anode. The charge-generation layer is provided between the first EL layer and the second EL layer. The first EL layer includes a third light-emitting layer, and the second EL layer includes a fourth light-emitting layer. At least one of the third light-emitting layer and the fourth light-emitting layer includes a first light-emitting layer and a second light-emitting layer. The first light-emitting layer is provided between the cathode and the second light-emitting layer. The second light-emitting layer is provided between the first light-emitting layer and the anode. The emission peak of the second light-emitting layer is at a shorter wavelength than that of the first light-emitting layer. The first light-emitting layer includes a host material and a guest material. The LUMO level of the guest material is in the range of ±0.1 eV of the LUMO level of the host material.

Another embodiment of the present invention is a light-emitting element including an EL layer between a pair of electrodes (an anode and a cathode). The EL layer includes a light-emitting layer. The light-emitting layer includes a first light-emitting layer and a second light-emitting layer. The first light-emitting layer is provided between the cathode and the second light-emitting layer. The second light-emitting layer is provided between the first light-emitting layer and the anode. The first light-emitting layer includes a region in contact with the second light-emitting layer. The emission peak of the second light-emitting layer is at a shorter wavelength than that of the first light-emitting layer. The first light-emitting layer and the second light-emitting layer include the same host material. The LUMO level of a guest material included in the first light-emitting layer is in the range of ±0.1 eV of the LUMO level of the host material.

Another embodiment of the present invention is a light-emitting element including a first EL layer, a second EL layer, and a charge-generation layer. The first EL layer, the second EL layer, and the charge-generation layer are provided between a cathode and an anode. The charge-generation layer is provided between the first EL layer and the second EL layer. The first EL layer includes a third light-emitting layer, and the second EL layer includes a fourth light-emitting layer. At least one of the third light-emitting layer and the fourth light-emitting layer includes a first light-emitting layer and a second light-emitting layer. The first light-emitting layer is provided between the cathode and the second light-emitting layer. The second light-emitting layer is provided between the first light-emitting layer and the anode. The emission peak of the second light-emitting layer is at a shorter wavelength than that of the first light-emitting layer. The first light-emitting layer and the second light-emitting layer include the same host material. The LUMO level of a guest material included in the first light-emitting layer is in the range of ±0.1 eV of the LUMO level of the host material.

In each of the aforementioned structures, the light-emitting element further includes a fifth light-emitting layer. The fifth light-emitting layer is provided between the first light-emitting layer and the cathode. The fifth light-emitting layer includes a region in contact with the first light-emitting layer. The fifth light-emitting layer and the second light-emitting layer include the same material.

In each of the aforementioned structures, the emission in the first light-emitting layer has a peak at a wavelength of 560 nm to 700 nm, and the emission in the second light-emitting layer has a peak at a wavelength of 500 nm to 560 nm.

In each of the aforementioned structures, the guest material included in the first light-emitting layer is a phosphorescent organometallic iridium complex.

Another embodiment of the present invention is a light-emitting device including the light-emitting element having any of the aforementioned structures.

The category of one embodiment of the present invention includes not only a light-emitting device including the light-emitting element but also an electronic device and a lighting device each including the light-emitting device. The light-emitting device in this specification therefore refers to an image display device or a light source (e.g., a lighting device). In addition, the light-emitting device might include any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted on a light-emitting element by a chip on glass (COG) method.

According to one embodiment of the present invention, a light-emitting element with a high current efficiency can be provided. According to another embodiment of the present invention, a low-power consumption light-emitting device including the light-emitting element can be provided. According to another embodiment of the present invention, low-power consumption electronic device and lighting device can be provided. According to another embodiment of the present invention, a novel light-emitting element, a novel light-emitting device, a novel lighting device, and the like can be provided. Note that the description of these effects does not disturb the existence of other effects. One embodiment of the present invention does not necessarily achieve all the above effects. Other effects will be apparent from and can be derived from the description of the specification, the drawings, the claims, and the like.

BEST MODE FOR CARRYING OUT THE INVENTION

Embodiments of the present invention will be described below in detail with reference to the drawings. Note that the present invention is not limited to the following description, and various changes and modifications can be made without departing from the spirit and scope of the present invention. Therefore, the present invention should not/be construed as being limited to the description in the following embodiments.

Embodiment 1

In this embodiment, a light-emitting element of one embodiment of the present invention will be described.

In the light-emitting element of one embodiment of the present invention, an EL layer including a light-emitting layer is provided between a pair of electrodes. The light-emitting layer has a stacked structure of a first light-emitting layer including at least a guest material (a light-emitting material) and a host material (an electron-transport material or a hole-transport material) and a second light-emitting layer including at least a guest material (a light-emitting material) and a host material (an electron-transport material or a hole-transport material).

The structure of the light-emitting element of one embodiment of the present invention will be described below with reference to FIG. 1.

Figure 1:
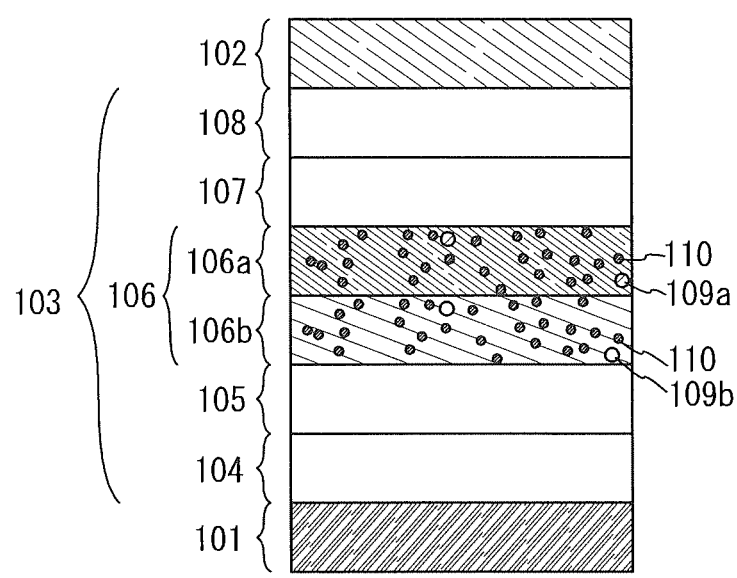
FIG. 1 illustrates a structure of a light-emitting element of one embodiment of the present invention.

In the light-emitting element illustrated in FIG. 1, an EL layer 103 that includes a light-emitting layer 106 is provided between a pair of electrodes (an anode 101 and a cathode 102). The EL layer 103 has a structure in which a hole-injection layer 104, a hole-transport layer 105, a light-emitting layer 106, an electron-transport layer 107, an electron-injection layer 108, and the like are stacked over the anode 101 in this order.

Note that the light-emitting layer 106 includes a plurality of light-emitting layers stacked; in FIG. 1, two light-emitting layers (a first light-emitting layer 106a and a second light-emitting layer 106b) are stacked. The first light-emitting layer 106a includes at least a guest material (a first light-emitting material) 109a and a host material 110. The second light-emitting layer 106b includes at least a guest material (a second light-emitting material) 109b and the host material 110.

As for the guest material (the first light-emitting material 109a and the second light-emitting material 109b) included in the light-emitting layer 106 (the first light-emitting layer 106a and the second light-emitting layer 106b), the emission peak of the second light-emitting material 109b is at a shorter wavelength than that of the first light-emitting material 109a. In addition, the LUMO level of the first light-emitting material 109a included in the first light-emitting layer 106a is in the range of ±0.1 eV of the LUMO level of the host material 110 included in the first light-emitting layer 106a.

As the host material 110 included in the light-emitting layer 106, an electron-transport material with an electron mobility of $10^{-6}$ cm$^2$/Vs or higher or a hole-transport material with a hole mobility of $10^{-6}$ cm$^2$/Vs or higher is mainly used.

When the light-emitting layer 106 has a structure in which the guest material is dispersed in the host material 110, crystallization of the light-emitting layer 106 can be suppressed. Furthermore, concentration quenching due to high concentration of the light-emitting material can be suppressed to increase the emission efficiency of the light-emitting element.

Note that the stacked light-emitting layers (106a and 106b) preferably contain the same host material 110; however, different materials can also be used as long as the light-emitting layers function properly.

In addition, the level of a triplet excitation energy (T1 level) of the host material 110 is preferably higher than the T1 level of the guest material (109a and 109b). This is because, when the T1 level of the host material 110 is lower than that of the guest material (109a and 109b), the triplet excitation energy of the light-emitting material (109a and 109b), which is to contribute to light emission, is quenched by the host material 110 and accordingly the emission efficiency is reduced.

Note that in the light-emitting element of one embodiment of the present invention illustrated in FIG. 1, the light-emitting layer in the EL layer has the structure in which the two layers of the first light-emitting layer 106a and the second light-emitting layer 106b are stacked on the cathode. Moreover, the first light-emitting layer 106a includes the host material 110 and the guest material (the first light-emitting material 109a) whose LUMO level is in the range of ±0.1 eV of the LUMO level of the host material 110. Hence, the carrier (electron) trapping properties in the first light-emitting layer 106a can be reduced, which prevents over-expansion of the light-emission region and increases the current efficiency. Furthermore, carriers (electrons) that are transferred from the first light-emitting layer 106a because of the aforementioned properties effectively move to the second light-emitting layer 106b in contact with the first light-emitting layer 106a, increasing the current efficiency of the second light-emitting layer 106b.

Also in the light-emitting element of one embodiment of the present invention illustrated in FIG. 1, a third light-emitting layer containing the same material as the second light-emitting layer 106b is preferably provided between the first light-emitting layer 106a and the cathode and in contact with the first light-emitting layer 106a. Such a structure offers a light-emitting element that is unlikely to be affected by a change in carrier balance over time, i.e., a long-life light-emitting element.

Next, a specific example in fabrication of the above light-emitting element will be described.

As the first electrode (anode) 101 and the second electrode (cathode) 102, a metal, an alloy, an electrically conductive compound, a mixture thereof, and the like can be used. Specifically, indium oxide-tin oxide (indium tin oxide), indium oxide-tin oxide containing silicon or silicon oxide, indium oxide-zinc oxide (indium zinc oxide), indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti) can be used. In addition, an element belonging to Group 1 or Group 2 of the periodic table, that is, an alkali metal such as lithium (Li) or cesium (Cs), an alkaline earth metal such as calcium (Ca) or strontium (Sr), magnesium (Mg), an alloy containing such an element (e.g., MgAg or AlLi), a rare earth metal such as europium (Eu) or ytterbium (Yb), an alloy containing such an element, graphene, and the like can be used. The first electrode (anode) 101 and the second electrode (cathode) 102 can be formed by, for example, a sputtering method or an evaporation method (including a vacuum evaporation method).

The hole-injection layer 104 injects holes into the light-emitting layer 106 through the hole-transport layer 105 with a high hole-transport property. The hole-injection layer 104 contains a hole-transport material and an acceptor substance, so that electrons are extracted from the hole-transport material by the acceptor substance to generate holes and the holes are injected into the light-emitting layer 106 through the hole-transport layer 105. Note that the hole-transport layer 105 is formed using a hole-transport material.

Specific examples of the hole-transport material, which is used for the hole-injection layer 104 and the hole-transport layer 105, include aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris(N,N-diphenyl amino)triphenylamine (abbreviation: TDATA), 4,4',4''-tris [N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); and 3-[N-(1-naphthyl)-N-(9-phenylcarbazol-3-yl)amino]-9-phenylcarbazole (abbreviation: PCzPCN1). Other examples include carbazole derivatives such as 4,4'-di(N-carbazolyl) biphenyl (abbreviation: CBP), 1,3,5-tris[4-(N-carbazolyl) phenyl]benzene (abbreviation: TCPB), and 9-[4-(10-phenyl-9-anthracenyl)phenyl]-9H-carbazole (abbreviation: CzPA). The substances listed here are mainly ones that have a hole mobility of $10^{-6}$ cm$^2$/Vs or higher. Note that any substance other than the substances listed here may be used as long as the hole-transport property is higher than the electron-transport property.

Other examples include high molecular compounds such as poly(N-vinylcarbazole) (abbreviation: PVK), poly(4-vinyltriphenylamine) (abbreviation: PVTPA), poly[N-(4-{N''-[4-(4-diphenylamino)phenyl]phenyl-N'-phenylamino}phenyemethacrylamide] (abbreviation: PTPDMA), and poly[N,N'-bis(4-butylphenyl)-N,N'-bis(phenyl)benzidine] (abbreviation: Poly-TPD).

Examples of the acceptor substance that is used for the hole-injection layer 104 include oxides of metals belonging to Groups 4 to 8 of the periodic table. Specifically, molybdenum oxide is particularly preferable.

The light-emitting layer 106 (the first light-emitting layer 106a and the second light-emitting layer 106b) includes the guest material 109 (109a and 109b) and the host material 110, each of which has the aforementioned structure.

There is no particular limitation on the material that can be used as the guest material (light-emitting material or emission center substance) (109a and 109b) in the light-emitting layer 106 (the first light-emitting layer 106a and the second light-emitting layer 106b). A light-emitting material that converts singlet excitation energy into luminescence or a light-emitting material that converts triplet excitation energy into luminescence can be used. Note that the emission color of the light-emitting material 109a has a shorter wavelength than the emission color of the light-emitting material 109b. Examples of the light-emitting material and the emission center substance are given below.

Examples of the light-emitting material that converts singlet excitation energy into luminescence include a substance that emits fluorescence such as N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yephenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), {2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), {2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]etheny}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM).

Furthermore, examples of the light-emitting material converting triplet excitation energy into luminescence include a substance emitting phosphorescence and a thermally activated delayed fluorescence (TADF) material that exhibits thermally activated delayed fluorescence. Note that "delayed fluorescence" exhibited by the TADF material refers to light emission having the same spectrum as normal fluorescence and an extremely long lifetime, i.e., $10^{-6}$ seconds or longer, preferably $10^{-3}$ seconds or longer.

Examples of the substance that emits phosphorescence include bis[2-(3',5'-bistrifluoromethylphenyl)pyridinato-N,$C^{2'}$]iridium(III) picolinate (abbreviation: Ir(CF$_3$ppy)$_2$(pic)), bis[2-(4',6'-difluorophenyl)pyridinato-N,$C^{2'}$]iridium(III) acetylacetonate (abbreviation: FIracac), tris(2-phenylpyridinato)iridium(III) (abbreviation: Ir(ppy)$_3$), bis(2-phenylpyridinato)iridium(III) acetylacetonate (abbreviation: Ir(ppy)2(acac)), tris(acetylacetonato) (monophenanthroline)terbium(III) (abbreviation: Tb(acac)3(Phen)), bis(benzo[h]quinolinato)iridium(III) acetylacetonate (abbreviation: Ir(bzq)2(acac)), bis(2,4-diphenyl-1,3-oxazolato-N,$C^{2'}$)iridium(III) acetylacetonate (abbreviation: Ir(dpo)$_2$(acac)), bis{2-[4'-(perfluorophenyl)phenyl]pyridinato-N,$C^{2'}$}iridium(III) acetylacetonate (abbreviation: Ir(p-PF-ph)$_2$(acac)), bis(2-phenylbenzothiazolato-N, $C^{2'}$)iridium(III) acetylacetonate (abbreviation: Ir(bt)$_2$(acac)), bis[2-(2'-benzo[4,5-α]thienyl)pyridinato-N,$C^{3'}$]iridium(III) acetylacetonate (abbreviation: Ir(btp)$_2$(acac)), bis(1-phenylisoquinolinato-N,$C^{2'}$)iridium(III) acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(3,5-dimethyl-2-phenylpyrazinato)iridium(III) (abbreviation: [Ir(mppr-Me)$_2$(acac)]), (acetylacetonato)bis(5-isopropyl-3-methyl-2-phenylpyrazinato) iridium(III) (abbreviation: [Ir(mppr-iPr)$_2$(acac)]), (acetylacetonato)bis(2,3,5-triphenylpyrazinato)iridium(III) (abbreviation: Ir(tppr)$_2$(acac)), bis(2,3,5-triphenylpyrazinato) (dipivaloylmethanato)iridium(III) (abbreviation: [Ir(tppr)$_2$(dpm)], (acetylacetonato)bis(6-tert-butyl-4-phenylpyrimidinato) iridium(III) (abbreviation: [Ir(tBuppm)$_2$(acac)]), (acetylacetonato)bis(4,6-diphenylpyrimidinato)iridium(III) (abbreviation: [Ir(dppm)$_2$(acac)]), 2,3,7,8,12,13,17,18-octaethyl-21H,23H-porphyrin platinum(II) (abbreviation:

PtOEP), tris(1,3-diphenyl-1,3-propanedionato) (monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)).

Specific examples of the TADF material include fullerene, a derivative thereof, an acridine derivative such as proflavine, and eosin. Other examples include a metal-containing porphyrin, such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$OEP). Alternatively, a heterocyclic compound including a π-electron rich heteroaromatic ring and a π-electron deficient heteroaromatic ring can be used, such as 2-(biphenyl-4-yl)-4,6-bis(12-phenylindolo[2,3-a]carbazol-11-yl)-1,3,5-triazine (PIC-TRZ). Note that a material in which the π-electron rich heteroaromatic ring is directly bonded to the π-electron deficient heteroaromatic ring is particularly preferably used because both the donor property of the π-electron rich heteroaromatic ring and the acceptor property of the π-electron deficient heteroaromatic ring are increased and the energy difference between the S1 level and the T1 level becomes small.

As the electron-transport material, which can be used as the host material 110 in the light-emitting layer 106 (106a and 106b), a π-electron deficient heteroaromatic compound such as a nitrogen-containing heteroaromatic compound is preferable, examples of which include quinoxaline derivatives and dibenzoquinoxaline derivatives such as 2-[3-(dibenzothiophen-4-yl)phenyl]dibenzo[f,h]quinoxaline (abbreviation: 2mDBTPDBq-II), 2-[3-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothlophen-4-yl)phenyl]dibenzo[f,h]quinoxaline (abbreviation: 6mDBTPDBq-II). Note that in the case where a quinoxaline derivative is used as the electron-transport host material, the guest material is preferably an organometallic complex (specifically, iridium complex) in which a ligand is a phenylpyrazine derivative having an alkyl group, because the electron-trapping properties are reduced.

As the hole-transport material, which can be used as the host material 110 in the light-emitting layer 106 (106a and 106b), a π-electron rich heteroaromatic compound (e.g., a carbazole derivative or an indole derivative) or an aromatic amine compound is preferable, examples of which include
4-phenyl-4'-(9-phenyl-9H-carbazol-3-yl)triphenylamine (abbreviation: PCBA1BP),
4,4'-di(1-naphthyl)-4"-(9-phenyl-9H-carbazol-3-yl)triphenylamine (abbreviation: PCBNBB), 3-[N-(1-naphthyl)-N-(9-phenylcarbazol-3-yl)amino]-9-phenylcarbazole (abbreviation: PCzPCN1), 4,4',4"-tris [N-(1-naphthyl)-N-phenylamino]triphenylamine (abbreviation: 1'-TNATA),
2,7-bis[N-(4-diphenylaminophenyl)-N-phenylamino]-spiro-9,9'-bifluorene (abbreviation: DPA2SF),
N,N'-bis(9-phenylcarbazol-3-yl)-N,N'-diphenylbenzene-1, 3-diamine (abbreviation: PCA2B), N-(9,9-dimethyl-2-diphenylamino-9H-fluoren-7-yl)diphenylamine (abbreviation: DPNF),
N,N',N"-triphenyl-N,N',N"-tris(9-phenylcarbazol-3-yl)benzene-1,3,5-triamine (abbreviation: PCA3B),
2-[N-(9-phenylcarbazol-3-yl)-N-phenylamino]spiro-9,9'-bifluorene (abbreviation: PCASF), 2-[N-(4-diphenylaminophenyl)-N-phenylamino]spiro-9,9'-bifluorene (abbreviation: DPASF),
N,N'-bis[4-(carbazol-9-yl)phenyl]-N,N'-diphenyl-9,9-dimethylfluorene-2,7-diamine (abbreviation: YGA2F), 4,4'-bis[N-(3-methylphenyl)-N-phenylamino]biphenyl (abbreviation: TPD), 4,4'-bis[N-(4-diphenylaminophenyl)-N-phenylamino]biphenyl (abbreviation: DPAB),
N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL),
3-[N-(9-phenylcarbazol-3-yl)-N-phenylamino]-9-phenylcarbazole (abbreviation: PCzPCA1), 3-[N-(4-diphenylaminophenyl)-N-phenylamino]-9-phenylcarbazole (abbreviation: PCzDPA1),
3,6-bis[N-(4-diphenylaminophenyl)-N-phenylamino]-9-phenylcarbazole (abbreviation: PCzDPA2),
4,4'-bis(N-{4-[N'-(3-methylphenyl)-N'-phenylamino]phenyl}-N-phenylamino)biphenyl (abbreviation: DNTPD),
3,6-bis[N-(4-diphenylaminophenyl)-N-(1-naphthyl)amino]-9-phenylcarbazole (abbreviation: PCzTPN2), and
3,6-bis[N-(9-phenylcarbazol-3-yl)-N-phenylamino]-9-phenylcarbazole (abbreviation: PCzPCA2).

Note that the light-emitting layer 106 (106a and 106b) may further include a material other than the host material and the guest material. For example, the light-emitting layer 106 (106a and 106b) preferably includes the aforementioned electron-transport material as the host material, and further includes the aforementioned hole-transport material.

The electron-transport layer 107 is a layer that contains a substance having a high electron-transport property. For the electron-transport layer 107, it is possible to use a metal complex such as Alq$_3$, tris(4-methyl-8-quinolinolato)aluminum (abbreviation: Almq$_3$), bis(10-hydroxybenzo[h]quinolinato)beryllium (abbreviation: BeBq$_2$), BAlq, Zn(BOX)$_2$, or bis[2-(2-hydroxyphenyl)benzothiazolato]zinc (abbreviation: Zn(BTZ)$_2$). A heteroaromatic compound such as 2-(4-biphenylyl)-5-(4-tert-butylphenyl)-1,3,4-oxadiazole (abbreviation: PBD), 1,3-bis [5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), or 4,4'-bis(5-methylbenzoxazol-2-yl)stilbene (abbreviation: BzOs) can also be used. A high molecular compound such as poly(2, 5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6, 6'-diyl)] (abbreviation: PF-BPy) can also be used. The substances listed here are mainly ones that have an electron mobility of $10^{-6}$ cm$^2$/Vs or higher. Note that any substance other than the substances listed here may be used for the electron-transport layer 107 as long as the electron-transport property is higher than the hole-transport property.

The electron-transport layer 107 is not limited to a single layer, but may be a stack of two or more layers each containing any of the substances listed above.

The electron-injection layer 108 is a layer that contains a substance having a high electron-injection property. For the electron-injection layer 108, an alkali metal, an alkaline earth metal, or a compound thereof such as lithium fluoride (LiF), cesium fluoride (CsF), calcium fluoride ($CaF_2$), or lithium oxide ($LiO_x$) can be used. A rare earth metal compound like erbium fluoride ($ErF_3$) can also be used. An electride may also be used for the electron-injection layer 108. Examples of the electride include a substance in which electrons are added at high concentration to calcium oxide-aluminum oxide. Any of the substances for forming the electron-transport layer 107, which are listed above, can also be used.

A composite material in which an organic compound and an electron donor (donor) are mixed may also be used for the electron-injection layer 108. The composite material is superior in an electron-injection property and an electron-transport property, since electrons are generated in the organic compound by the electron donor. In this case, the organic compound is preferably a material that is excellent in transporting the generated electrons. Specifically, for example, the substances for forming the electron-transport layer 107 (e.g., a metal complex or a heteroaromatic compound), which are given above, can be used. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like are given. In addition, an alkali metal oxide or an alkaline earth metal oxide is preferable, and lithium oxide, calcium oxide, and barium oxide are given. A Lewis base such as magnesium oxide can also be used. An organic compound such as tetrathiafulvalene (abbreviation: TTF) can also be used.

Note that each of the hole-injection layer 104, the hole-transport layer 105, the light-emitting layer 106 (106a and 106b), the electron-transport layer 107, and the electron-injection layer 108 can be formed by a method such as an evaporation method (e.g., a vacuum evaporation method), an ink jet method, or a coating method.

In the above-described light-emitting element, carriers are injected because of a potential difference generated between the first electrode 101 and the second electrode 102, and the holes and the electrons are recombined in the EL layer 103, whereby light is emitted. Then, the emitted light is extracted outside through one or both of the first electrode 101 and the second electrode 102. Thus, one or both of the first electrode 101 and the second electrode 102 are electrodes having light-transmitting properties.

A light-emitting element having the structure described in this embodiment can emit light with plural kinds of colors, particularly emit a kind of color light with a high efficiency, which increases the current efficiency of the other emission colors and also increases the emission efficiency of the whole light-emitting element.

The structure described in this embodiment can be combined as appropriate with any of the structures described in the other embodiments.

Embodiment 2

In this embodiment, as one embodiment of the present invention, a light-emitting element (hereinafter referred to as a tandem light-emitting element) that includes a plurality of EL layers with a charge-generation layer provided therebetween will be described with reference to FIGS. 2A and 2B.

Figure 2A:
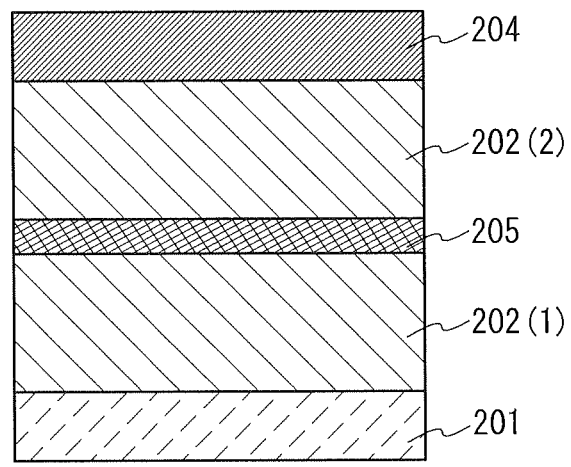
FIGS. 2A and 2B each illustrate a structure of a light-emitting element.

A light-emitting element described in this embodiment is a tandem light-emitting element including a plurality of EL layers (a first EL layer 202(1) and a second EL layer 202(2)) between a pair of electrodes (a first electrode 201 and a second electrode 204) as illustrated in FIG. 2A.

In this embodiment, the first electrode 201 functions as an anode, and the second electrode 204 functions as a cathode. Note that the first electrode 201 and the second electrode 204 can have structures similar to those described in Embodiment 1. In addition, all or any of the plurality of EL layers (the first EL layer 202(1) and the second EL layer 202(2)) may have structures similar to those described in Embodiment 1. In other words, the structures of the first EL layer 202(1) and the second EL layer 202(2) may be the same or different from each other and can be similar to those of the EL layers described in Embodiment 1.

In addition, a charge-generation layer 205 is provided between the plurality of EL layers (the first EL layer 202(1) and the second EL layer 202(2)). The charge-generation layer 205 has a function of injecting electrons into one of the EL layers and injecting holes into the other of the EL layers when voltage is applied between the first electrode 201 and the second electrode 204. In this embodiment, when voltage is applied such that the potential of the first electrode 201 is higher than that of the second electrode 204, the charge-generation layer 205 injects electrons into the first EL layer 202(1) and injects holes into the second EL layer 202(2).

Note that in terms of light extraction efficiency, the charge-generation layer 205 preferably has a property of transmitting visible light (specifically, the charge-generation layer 205 has a visible light transmittance of 40% or more). The charge-generation layer 205 functions properly even when it has lower conductivity than the first electrode 201 or the second electrode 204.

The charge-generation layer 205 may have either a structure in which an electron acceptor (acceptor) is added to a hole-transport material or a structure in which an electron donor (donor) is added to an electron-transport material. Alternatively, both of these structures may be stacked.

In the case of the structure in which an electron acceptor is added to a hole-transport material, as the hole-transport material, for example, an aromatic amine compound such as NPB, TPD, TDATA, M (DATA, or 4,4'-bis[N-(spiro-9,9'-bifluoren-2-yl)-N-phenylamino]biphenyl (abbreviation: BSPB), can be used. The substances listed here are mainly ones that have a hole mobility of $10^{-6}$ $cm^2/Vs$ or higher. Note that any substance other than the materials listed here may be used as long as the hole-transport property is higher than the electron-transport property.

Examples of the electron acceptor include 7,7,8,8-tetracyano-2,3,5,6-tetrafluoroquinodimethane (abbreviation: F4-TCNQ), and chloranil. Transition metal oxides can also be given. Oxides of metals belonging to Groups 4 to 8 of the periodic table can also be used. Specifically, vanadium oxide, niobium oxide, tantalum oxide, chromium oxide, molybdenum oxide, tungsten oxide, manganese oxide, and rhenium oxide are preferable because of their high electron-accepting properties. Among these, molybdenum oxide is especially preferable because it is stable in the air, has a low hygroscopic property, and is easy to handle.

On the other hand, in the case of the structure in which an electron donor is added to an electron-transport material, as the electron-transport material, for example, a metal complex having a quinoline skeleton or a benzoquinoline skeleton, such as Alq, $Almq_3$, $BeBq_2$, or BAlq can be used. Alternatively, a metal complex having an oxazole-based ligand or a thiazole-based ligand, such as $Zn(BOX)_2$ or $Zn(BTZ)_2$ can be used. Further alternatively, in addition to such a metal complex, PBD, OXD-7, TAZ, BPhen, BCP, or the like can be used. The materials listed here are mainly ones that have an electron mobility of $10^{-6}$ cm$^2$/Vs or higher. Note that any substance other than the materials listed here may be used as long as the electron-transport property is higher than the hole-transport property.

As the electron donor, it is possible to use an alkali metal, an alkaline earth metal, a rare earth metal, metals belonging to Groups 2 and 13 of the periodic table, or an oxide or carbonate thereof. Specifically, lithium (Li), cesium (Cs), magnesium (Mg), calcium (Ca), ytterbium (Yb), indium (In), lithium oxide, cesium carbonate, or the like is preferably used. Alternatively, an organic compound such as tetrathianaphthacene may be used as the electron donor.

Note that forming the charge-generation layer 205 by using any of the above materials can suppress a drive voltage increase caused by the stack of the EL layers.

Figure 2B:
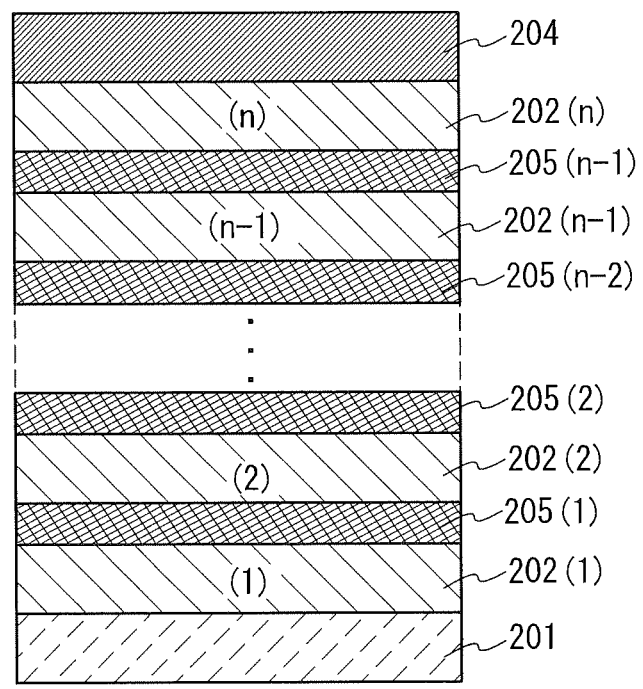

Although the light-emitting element including two EL layers is described in this embodiment, the present invention can be similarly applied to a light-emitting element in which n EL layers (202(1) to 202(n)) (n is three or more) are stacked as illustrated in FIG. 2B. In the case where a plurality of EL layers are included between a pair of electrodes as in the light-emitting element according to this embodiment, by providing charge-generation layers (205(1) to 205(n-1)) between the EL layers, light emission in a high luminance region can be obtained with current density kept low. Since the current density can be kept low, the element can have a long lifetime. When the light-emitting element is applied to lighting, voltage drop due to resistance of an electrode material can be reduced, which results in homogeneous light emission in a large area. In addition, a low-power-consumption light-emitting device that can be driven at low voltage can be achieved.

When the EL layers have different emission colors, a desired emission color can be obtained from the whole light-emitting element. For example, in the light-emitting element having two EL layers, when an emission color of the first EL layer and an emission color of the second EL layer are made to be complementary colors, a light-emitting element emitting white light as a whole light-emitting element can also be obtained. Note that "complementary colors" refer to colors that can produce an achromatic color when mixed. In other words, when light obtained from a light-emitting substance and light of a complementary color are mixed, white light emission can be obtained.

The same can be applied to a light-emitting element having three EL layers. For example, the light-emitting element as a whole can provide white light emission when the emission color of the first EL layer is red (e.g., the emission spectrum has a peak at 580 nm to 680 nm), the emission color of the second EL layer is green (e.g., the emission spectrum has a peak at 500 nm to 560 nm), and the emission color of the third EL layer is blue (e.g., the emission spectrum has a peak at 400 nm to 480 nm).

As a light-emitting device including the above-described light-emitting element, a passive matrix light-emitting device and an active matrix light-emitting device can be fabricated. It is also possible to fabricate a light-emitting device having a microcavity structure. Each of the light-emitting devices is one embodiment of the present invention.

Note that there is no particular limitation on the structure of the transistor (FET) in the case of fabricating the active matrix light-emitting device. For example, a staggered FET or an inverted staggered FET can be used as appropriate. A driver circuit formed over an FET substrate may be formed using both an n-type FET and a p-type FET or only either an n-type FET or a p-type FET. Furthermore, there is no particular limitation on the crystallinity of a semiconductor film used for the FET. For example, either an amorphous semiconductor film or a crystalline semiconductor film can be used. Examples of a semiconductor material include Group 13 semiconductors (e.g., gallium), Group 14 semiconductors (e.g., silicon), compound semiconductors (including oxide semiconductors), and organic semiconductors.

The structure described in this embodiment can be combined as appropriate with any of the structures described in the other embodiments.

Embodiment 3

In this embodiment, a light-emitting device of one embodiment of the present invention will be described.

Figure 3:
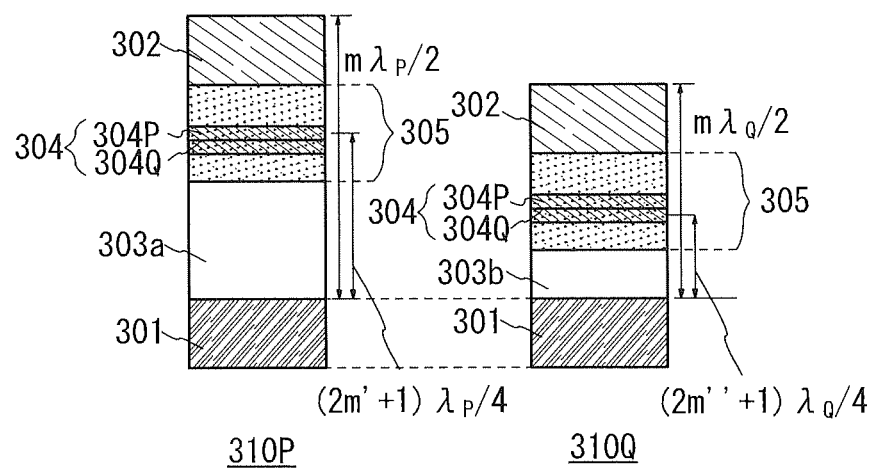
FIG. 3 illustrates a structure of a light-emitting element.

A light-emitting device described in this embodiment has a micro optical resonator (microcavity) structure, which utilizes a light resonant effect between a pair of electrodes. The light-emitting device includes a plurality of light-emitting elements each of which has at least an EL layer 305 between a pair of electrodes (a reflective electrode 301 and a transflective electrode 302) as illustrated in FIG. 3. The EL layer 305 includes at least a light-emitting layer 304 serving as a light-emitting area and may further include a hole-injection layer, a hole-transport layer, an electron-transport layer, an electron-injection layer, a charge-generation layer, and the like.

The light-emitting device described in this embodiment includes two kinds of light-emitting elements (a first light-emitting element 310P and a second light-emitting element 310Q) as illustrated in FIG. 3.

The first light-emitting element 310P has a structure in which a first transparent conductive layer 303a, the EL layer 305 partly including the light-emitting layer 304, and the transflective electrode 302 are stacked in this order over the reflective electrode 301. The second light-emitting element 310Q has a structure in which a second transparent conductive layer 303b, the EL layer 305 partly including the light-emitting layer 304, and the transflective electrode 302 are stacked in this order over the reflective electrode 301.

The reflective electrode 301, the EL layer 305, and the transflective electrode 302 are common to the two kinds of light-emitting elements in this embodiment. The light-emitting layer 304 has a stacked structure of a layer that emits light ($\lambda_P$) having a peak in a first wavelength region and a layer that emits light ($\lambda_Q$) having a peak in a second wavelength region. In this case, the above wavelengths satisfy the relation of $\lambda_Q < \lambda_P$.

Each of the light-emitting elements has a structure in which the EL layer 305 is provided between the reflective electrode 301 and the transflective electrode 302. Light emitted in all directions from the light-emitting layers included in the EL layer 305 is resonated by the reflective electrode 301 and the transflective electrode 302 which function as a micro optical resonator (a microcavity).

Note that the reflective electrode 301 is formed using a conductive material having reflectivity, and is formed to a film having a visible light reflectivity of 40% to 100%, preferably 70% to 100%, and a resistivity of $1 \times 10^{-2}$ Ωcm or lower. In addition, the transflective electrode 302 is formed using a conductive material having reflectivity and a conductive material having a light-transmitting property, and is formed to a film having a visible light reflectivity or 20% to 80%, preferably 40% to 70%, and a resistivity of $1\times10^{-2}$ Ωcm or lower.

The first transparent conductive layer 303a and the second transparent conductive layer 303b are formed to different thicknesses, whereby the two kinds of light-emitting elements differ from each other in the optical distance between the reflective electrode 301 and the transflective electrode 302. Thus, light with a wavelength that is resonated between the reflective electrode 301 and the transflective electrode 302 can be intensified while light with a wavelength that is not resonated therebetween can be attenuated, so that light with wavelengths which differ depending on the light-emitting elements can be extracted.

Furthermore, in the first light-emitting element 310P, the total thickness (total optical thickness) from the reflective electrode 301 to the transflective electrode 302 is set to $m\lambda_P/2$ (m is a natural number), and in the second light-emitting element 310Q, the total thickness from the reflective electrode 301 to the transflective electrode 302 is set to $m\lambda_Q/2$ (m is a natural number).

In this manner, the light ($\lambda_P$) emitted from the first light-emitting layer 304P included in the EL layer 305 is mainly extracted from the first light-emitting element 310P, and the light ($\lambda_Q$) emitted from the second light-emitting layer 304Q included in the EL layer 305 is mainly extracted from the second light-emitting element 310Q. Note that the light extracted from each of the light-emitting elements is emitted from the transflective electrode 302 side.

Furthermore, strictly speaking, the total thickness from the reflective electrode 301 to the transflective electrode 302 can be the total thickness from a reflection region in the reflective electrode 301 to a reflection region in the transflective electrode 302. However, it is difficult to precisely determine the positions of the reflection regions in the reflective electrode 301 and the transflective electrode 302; therefore, it is presumed that the above effect can be sufficiently obtained wherever the reflection regions may be set in the reflective electrode 301 and the transflective electrode 302.

Moreover, in the first light-emitting element 310P, the optical distance between the reflective electrode 301 and the first light-emitting layer 304P is adjusted to a desired thickness ($(2m'+1)\lambda_P/4$, where m' is a natural number); thus, light emitted from the first light-emitting layer 304P can be amplified.

Note that strictly speaking, the optical distance between the reflective electrode 301 and the first light-emitting layer 304P can be the optical distance between a reflection region in the reflective electrode 301 and a light-emitting region in the first light-emitting layer 304P. However, it is difficult to precisely determine the positions of the reflection region in the reflective electrode 301 and the light-emitting region in the first light-emitting layer 304P; therefore, it is presumed that the above effect can be sufficiently obtained wherever the light-emitting region may be set in the first light-emitting layer 304P.

Moreover, in the second light-emitting element 310Q, the optical distance between the reflective electrode 301 and the second light-emitting layer 304Q is adjusted to a desired thickness ($(2m''+1)\lambda_Q/4$, where m" is a natural number); thus, light emitted from the second light-emitting layer 304Q can be amplified.

Note that strictly speaking, the optical distance between the reflective electrode 301 and the second light-emitting layer 304Q can be the optical distance between a reflection region in the reflective electrode 301 and a light-emitting region in the second light-emitting layer 304Q. However, it is difficult to precisely determine the positions of the reflection region in the reflective electrode 301 and the light-emitting region in the second light-emitting layer 304Q; therefore, it is presumed that the above effect can be sufficiently obtained wherever the light-emitting region may be set in the second light-emitting layer 304Q.

Note that the light-emitting element in the above-described structure includes a plurality of light-emitting layers in the EL layer, the present invention is not limited thereto; for example, the structure of the tandem light-emitting element which is described in Embodiment 2 can be combined, in which case one light-emitting element includes a plurality of EL layers with a charge-generation layer therebetween and one or more light-emitting layers are formed in each of the EL layers.

The light-emitting device described in this embodiment has a microcavity structure. Light with wavelengths which differ depending on the light-emitting element can be extracted even when they include the same EL layer, so that it is not needed to form light-emitting elements for plural colors. Therefore, the above structure is advantageous for full color display owing to easiness in achieving higher resolution display or the like. Note that a combination with coloring layers (color filters) is also possible. In addition, emission intensity with a predetermined wavelength in the front direction can be increased, whereby power consumption can be reduced. The above structure is particularly useful in the case of being applied to a color display (image display device) including pixels of three or more colors but may also be applied to lighting or the like.

Embodiment 4

In this embodiment, a light-emitting device including a light-emitting element of one embodiment of the present invention will be described.

The light-emitting device may be either a passive matrix light-emitting device or an active matrix light-emitting device. Note that any of the light-emitting elements described in the other embodiments can be used for the light-emitting device described in this embodiment.

In this embodiment, an active matrix light-emitting device is described with reference to FIGS. 4A and 4B.

Figure 4A:
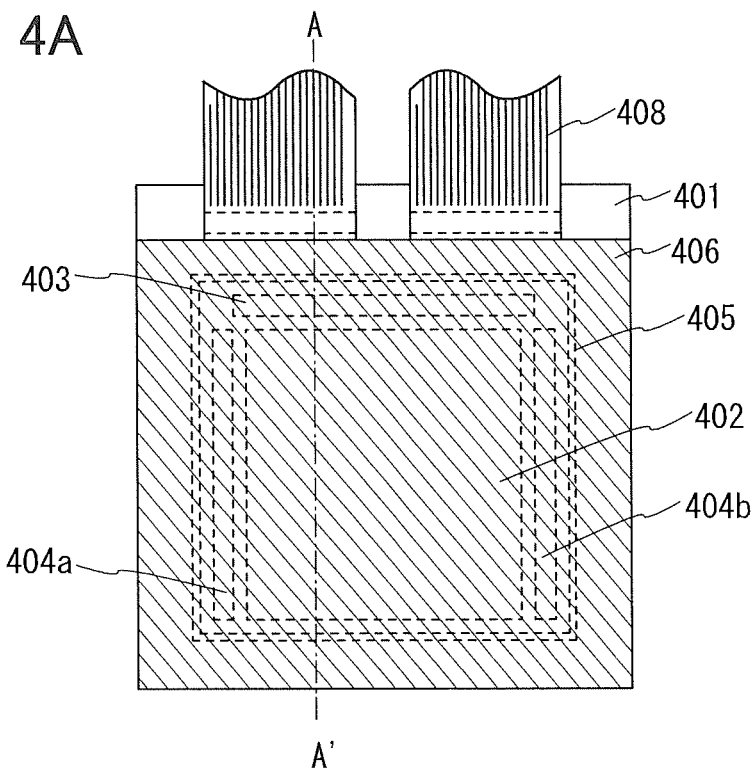
FIGS. 4A and 4B illustrate a structure of a light-emitting device.
Figure 4B:
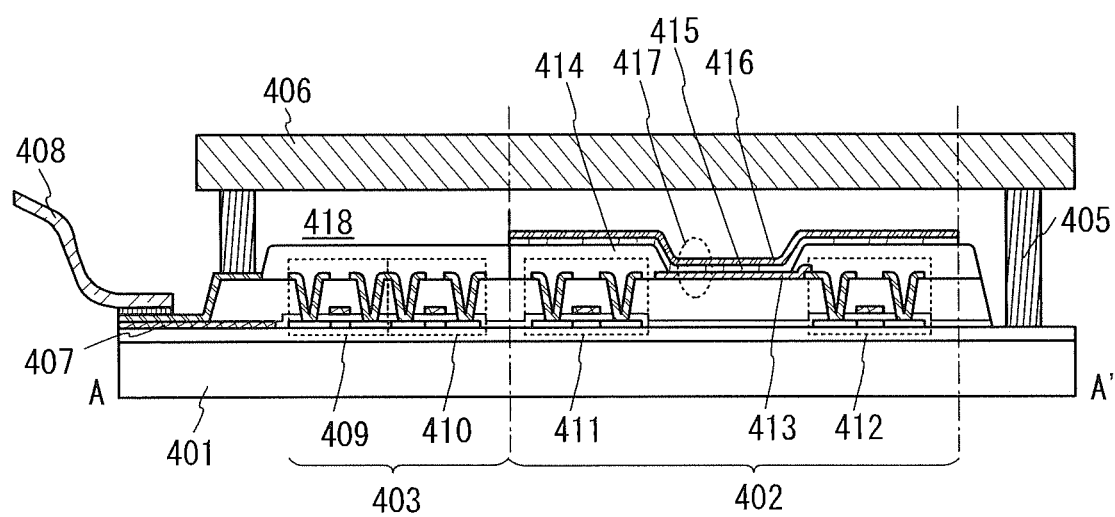

Note that FIG. 4A is a top view illustrating a light-emitting device and FIG. 4B is a cross-sectional view taken along the chain line A-A' in FIG. 4A. In the active matrix light-emitting device according to this embodiment, a pixel portion 402, a driver circuit portion (a source line driver circuit) 403, and driver circuit portions (gate line driver circuits) 404 (404a and 404b) are provided over an element substrate 401. The pixel portion 402, the driver circuit portion 404, and the driver circuit portions 404 are sealed between the element substrate 401 and a sealing substrate 406 with a sealant 405.

In addition, a lead wiring 407 for connecting an external input terminal is provided over the element substrate 401. Through the external input terminal, a signal (e.g., a video signal, a clock signal, a start signal, or a reset signal) or a potential is transmitted from the outside to the driver circuit portion 403 and the driver circuit portions 404. Here, a flexible printed circuit (FPC) 408 is provided as an example of the external input terminal. Although only the FPC is illustrated here, the FPC may be provided with a printed wiring board (PWB). The light-emitting device in this specification includes, in its category, not only the light-emitting device itself but also the light-emitting device provided with the FPC or the PWB.

Next, a cross-sectional structure is described with reference to FIG. 4B. The driver circuit portion and the pixel portion are formed over the element substrate 401; the driver circuit portion 403 that is the source line driver circuit and the pixel portion 402 are illustrated here.

As an example of the driver circuit portion 403, an FET 409 and an FET 410 are combined. Note that the driver circuit portion 403 may be formed with a circuit including transistors having the same conductivity type (either an n-channel transistor or a p-channel transistor) or a CMOS circuit including an n-channel transistor and a p-channel transistor. In this embodiment, the driver circuit is integrated with the substrate; however, the driver circuit is not necessarily formed over the substrate, and may be formed outside the substrate.

The pixel portion 402 includes a plurality of pixels each of which includes a switching FET 411, a current control FET 412, and a first electrode (anode) 413 that is electrically connected to a wiring (a source electrode or a drain electrode) of the current control FET 412. In this embodiment, the pixel portion 402 includes, but is not limited to, two FETs, the switching FET 411 and the current control FET 412. The pixel portion 402 may include, for example, three or more FETs and a capacitor in combination.

As the FETs 409, 410, 411, and 412, for example, a staggered transistor or an inverted staggered transistor can be used. Examples of a semiconductor material that can be used for the FETs 409, 410, 411, and 412 include Group 13 semiconductors (e.g., gallium), Group 14 semiconductors (e.g., silicon), compound semiconductors, oxide semiconductors, and organic semiconductors. In addition, there is no particular limitation on the crystallinity of the semiconductor material, and an amorphous semiconductor or a crystalline semiconductor can be used. In particular, an oxide semiconductor is preferably used for the FETs 409, 410, 411, and 412. Examples of the oxide semiconductor include an In—Ga oxide and an In—M—Zn oxide (M is Al, Ga, Y, Zr, La, Ce, or Nd). For example, an oxide semiconductor that has an energy gap of 2 eV or more, preferably 2.5 eV or more, further preferably 3 eV or more is used for the FETs 409, 410, 411, and 412, so that the off-state current of the transistors can be reduced.

An insulator 414 is formed to cover end portions of the first electrode 413. In this embodiment, the insulator 414 is formed using a positive photosensitive acrylic resin. The first electrode 413 is used as an anode in this embodiment.

The insulator 414 preferably has a curved surface with curvature at an upper end portion or a lower end portion thereof. This provides favorable coverage with a film to be formed over the insulator 414. The insulator 414 can be formed using, for example, either a negative photosensitive resin or a positive photosensitive resin. The material of the insulator 414 is not limited to an organic compound, and an inorganic compound such as silicon oxide, silicon oxynitride, or silicon nitride can also be used.

An EL layer 415 and a second electrode (cathode) 416 are formed over the first electrode (anode) 413. The EL layer 415 includes at least a light-emitting layer that has the stacked structure shown in Embodiment 1. In addition to the light-emitting layer, a hole-injection layer, a hole-transport layer, an electron-transport layer, an electron-injection layer, a charge-generation layer, and the like can be provided as appropriate in the EL layer 415.

A light-emitting element 417 is formed with a stack of the first electrode (anode) 413, the EL layer 415, and the second electrode (cathode) 416. For the first electrode (anode) 413, the EL layer 415, and the second electrode (cathode) 416, the materials described in Embodiment 1 can be used. Although not illustrated, the second electrode (cathode) 416 is electrically connected to the FPC 408 which is an external input terminal.

Although the cross-sectional view of FIG. 4B illustrates only one light-emitting element 417, a plurality of light-emitting elements are arranged in matrix in the pixel portion 402. Light-emitting elements which provide three kinds of light emission (R, G, and B) are selectively formed in the pixel portion 402, whereby a light-emitting device capable of full color display can be fabricated. Other than the light-emitting element which provides three kinds of light emission (R, G, and B), for example, a light-emitting element that emits white (W), yellow (Y), magenta (M), and cyan (C) light may be formed. When the above light-emitting element that provides several kinds of light emission is provided as well as a light-emitting element that provides three kinds of light emission (R, G, and B), for example, higher color purity, lower power consumption, or the like can be achieved. Alternatively, a light-emitting device capable of performing full color display may be provided by a combination with color filters.

Furthermore, the sealing substrate 406 is attached to the element substrate 401 with the sealant 405, whereby a light-emitting element 417 is provided in a space 418 surrounded by the element substrate 401, the sealing substrate 406, and the sealant 405. Note that the space 418 may be filled with an inert gas (such as nitrogen and argon) or the sealant 405.

An epoxy-based resin or glass frit is preferably used for the sealant 405. The material preferably allows as little moisture and oxygen as possible to penetrate. As the sealing substrate 406, a glass substrate, a quartz substrate, or a plastic substrate formed of fiber-reinforced plastic (FRP), poly(vinyl fluoride) (PVF), polyester, acrylic, or the like can be used. In the case where glass frit is used as the sealant, the element substrate 401 and the sealing substrate 406 are preferably glass substrates for high adhesion.

An active matrix light-emitting device can be obtained in the above manner.

The structure described in this embodiment can be combined as appropriate with any of the structures described in the other embodiments.

Embodiment 5

In this embodiment, examples of a variety of electronic devices that are completed using a light-emitting device will be described with reference to FIGS. 5A to 5D. The light-emitting device is fabricated using the light-emitting element of one embodiment of the present invention.

Examples of electronic devices including the light-emitting device include television devices (also referred to as TV or television receivers), monitors for computers and the like, cameras such as digital cameras and digital video cameras, digital photo frames, mobile phones (also referred to as cellular phones or portable telephone devices), portable game machines, portable information terminals, audio playback devices, and large game machines such as pachinko machines. Specific examples of the electronic devices are illustrated in FIGS. 5A to 5D.

Figure 5A:
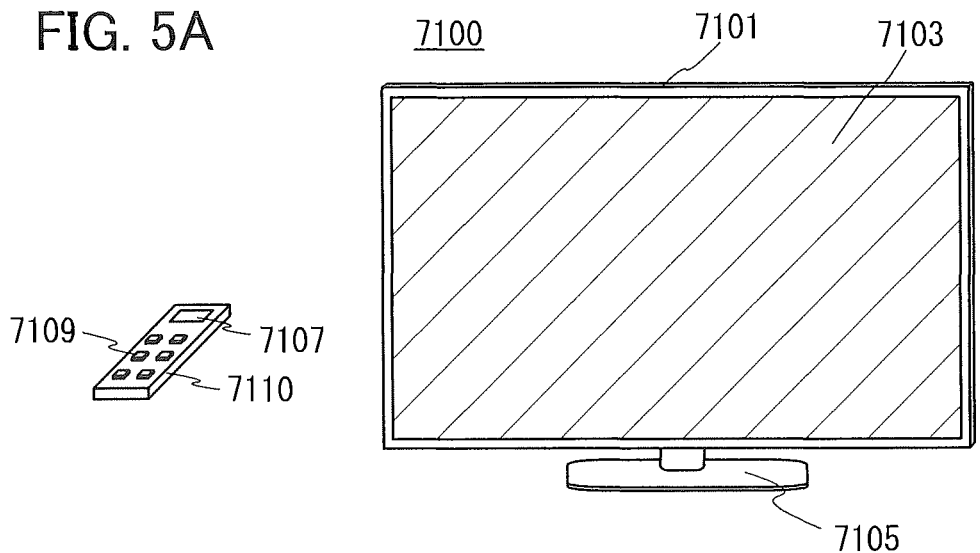
FIGS. 5A to 5D each illustrate an electronic device and FIGS. 5D'1 to 5D'2 each illustrate an electronic device.

FIG. 5A illustrates an example of a television device. In the television device 7100, a display portion 7103 is incorporated in a housing 7101. Images can be displayed on the display portion 7103, and the light-emitting device can be used for the display portion 7103. In addition, here, the housing 7101 is supported by a stand 7105

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the use of the receiver, general television broadcasts can be received. Moreover, when the television device is connected to a communication network with or without wires via the modem, one-way (from a sender to a receiver) or two-way (between a sender and a receiver or between receivers) information communication can be performed.

Figure 5B:
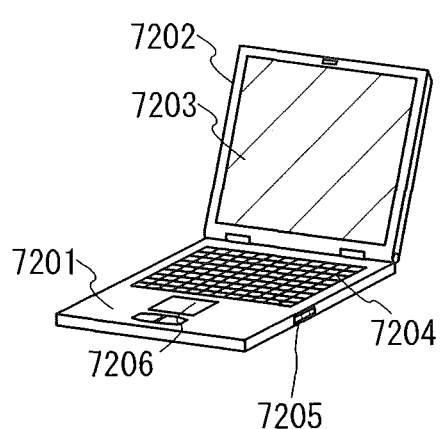

FIG. 5B illustrates a computer, which includes a main body 7201, a housing 7202, a display portion 7203, a keyboard 7204, an external connection port 7205, a pointing device 7206, and the like. Note that this computer can be manufactured using the light-emitting device for the display portion 7203.

Figure 5C:
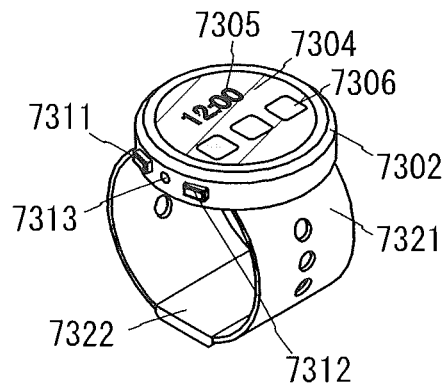

FIG. 5C illustrates a smart watch, which includes a housing 7302, a display panel 7304, operation buttons 7311 and 7312, a connection terminal 7313, a band 7321, a clasp 7322, and the like.

The display panel 7304 mounted in the housing 7302 serving as a bezel includes a non-rectangular display region. The display panel 7304 can display an icon 7305 indicating time, another icon 7306, and the like.

The smart watch illustrated in FIG. 5C can have a variety of functions, for example, a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading program or data stored in a recording medium and displaying the program or data on a display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting device for the display panel 7304.

Figure 5D:
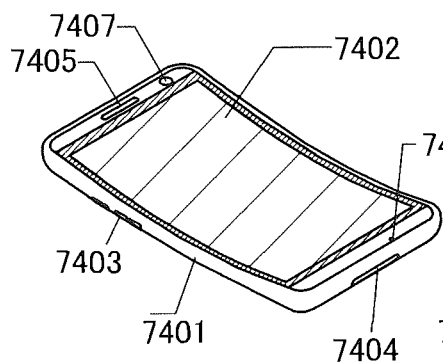
Figure 5D:
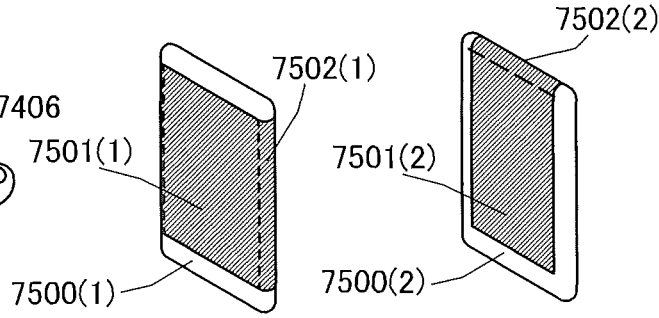

FIG. 5D illustrates an example of a mobile phone (e.g., smartphone). A mobile phone 7400 includes a housing 7401 provided with a display portion 7402, a microphone 7406, a speaker 7405, a camera 7407, an external connection portion 7404, an operation button 7403, and the like. In the case where the light-emitting element of one embodiment of the present invention is formed over a flexible substrate, the light-emitting element can be used for the display portion 7402 having a curved surface as illustrated in FIG. 5D.

When the display portion 7402 of the mobile phone 7400 illustrated in FIG. 5D is touched with a finger or the like, data can be input to the mobile phone 7400. In addition, operations such as making a call and composing an e-mail can be performed by touch on the display portion 7402 with a finger or the like.

There are mainly three screen modes of the display portion 7402. The first mode is a display mode mainly for displaying an image. The second mode is an input mode mainly for inputting data such as text. The third mode is a display-and-input mode in which two modes of the display mode and the input mode are combined.

For example, in the case of making a call or creating e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device such as a gyro sensor or an acceleration sensor is provided inside the mobile phone 7400, display on the screen of the display portion 7402 can be automatically changed by determining the orientation of the mobile phone 7400 (whether the mobile phone is placed horizontally or vertically).

The screen modes are changed by touch on the display portion 7402 or operation with the button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. In addition, when a backlight or a sensing light source that emits near-infrared light is provided in the display portion, an image of a finger vein, a palm vein, or the like can be taken.

Furthermore, the light-emitting device can be used for a mobile phone having a structure illustrated in FIG. 5D'-1 or FIG. 5D'-2, which is another structure of the mobile phone (e.g., smartphone).

Note that in the case of the structure illustrated in FIG. 5D'-1 or FIG. 5D'-2, text data, image data, or the like can be displayed on second screens 7502(1) and 7502(2) of housings 7500(1) and 7500(2) as well as first screens 7501(1) and 7501(2). Such a structure enables a user to easily see text data, image data, or the like displayed on the second screens 7502(1) and 7502(2) while the mobile phone is placed in user's breast pocket.

As described above, the electronic devices can be obtained using the light-emitting device that includes the light-emitting element of one embodiment of the present invention. Note that the light-emitting device can be used for electronic devices in a variety of fields without being limited to the electronic devices described in this embodiment.

The structure described in this embodiment can be combined as appropriate with any of the structures described in the other embodiments.

Embodiment 6

In this embodiment, examples of lighting devices will be described with reference to FIG. 6. Each of the lighting devices uses a light-emitting device including the light-emitting element of one embodiment of the present invention.

Figure 6:
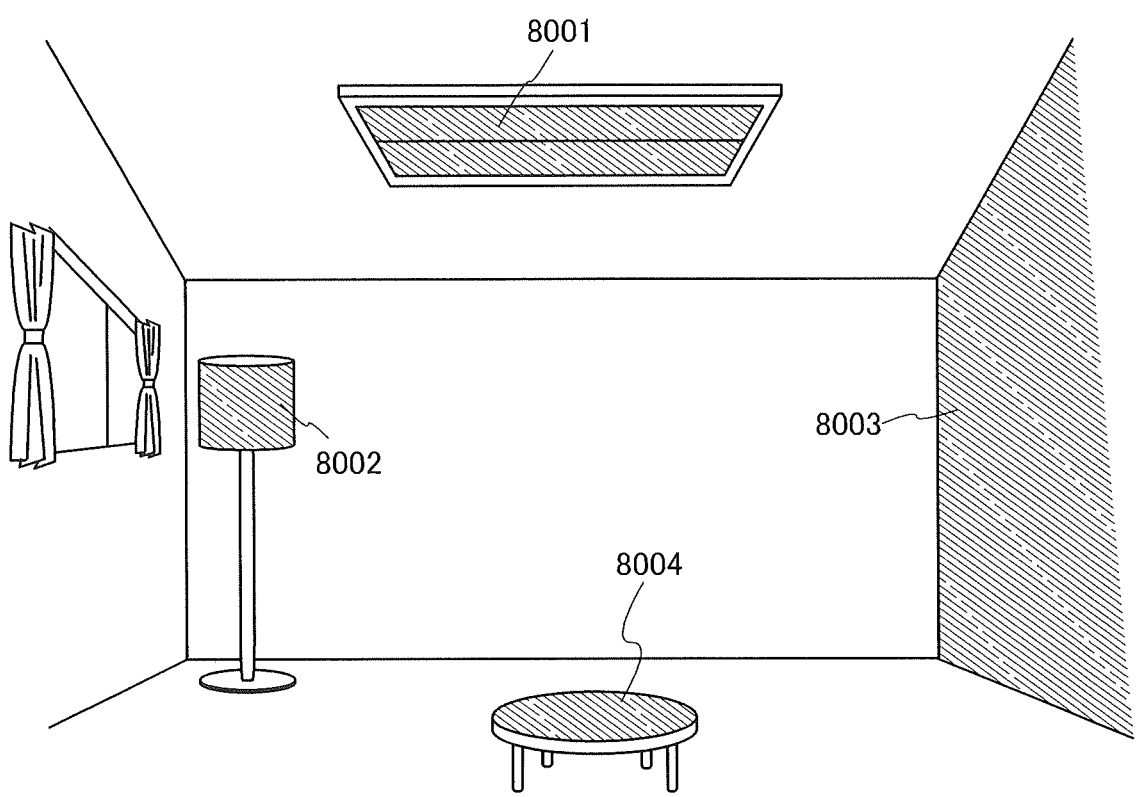
FIG. 6 illustrates lighting devices.

FIG. 6 illustrates an example in which the light-emitting device is used as an indoor lighting device 8001. Since the light-emitting device can have a large area, it can be used for a lighting device having a large area. In addition, a lighting device 8002 in which a light-emitting region has a curved surface can also be obtained with the use of a housing with a curved surface. A light-emitting element included in the light-emitting device described in this embodiment is in a thin film form, which allows the housing to be designed more freely. Thus, the lighting device can be elaborately designed in a variety of ways. In addition, a wall of the room may be provided with a large-sized lighting device 8003.

When the light-emitting device is used for a surface of a table, a lighting device 8004 that has a function as a table can be obtained. When the light-emitting device is used as part of other furniture, a lighting device that functions as the furniture can be obtained.

As described above, a variety of lighting devices that include the light-emitting device can be obtained. Note that these lighting devices are also embodiments of the present invention.

The structure described in this embodiment can be combined as appropriate with any of the structures described in the other embodiments.

EXAMPLE

In this example, a light-emitting element 1 and a light-emitting element 2 of one embodiment of the present invention, and a comparative light-emitting element 3 and a comparative light-emitting element 4 for comparison were fabricated. The element structures will be described in detail with reference to FIG. 7. A light-emitting element in this example has a structure combining the tandem structure described in Embodiment 2 and the microcavity structure described in Embodiment 3. Chemical formulae of materials used in this example are shown below.

-continued

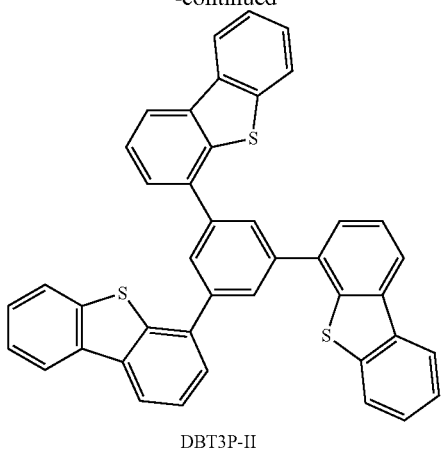

DBT3P-II

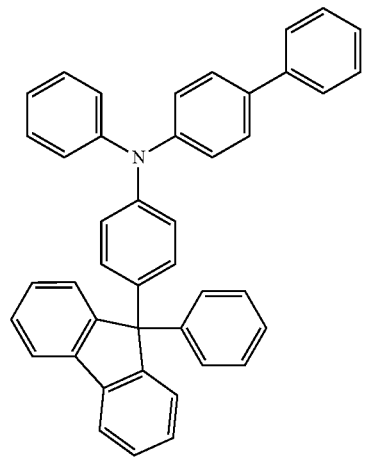

BPAFLP

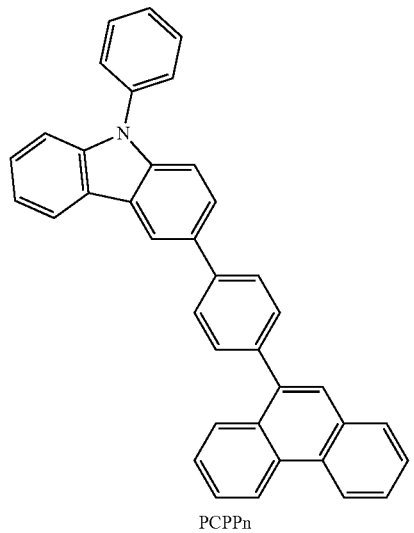

PCPPn

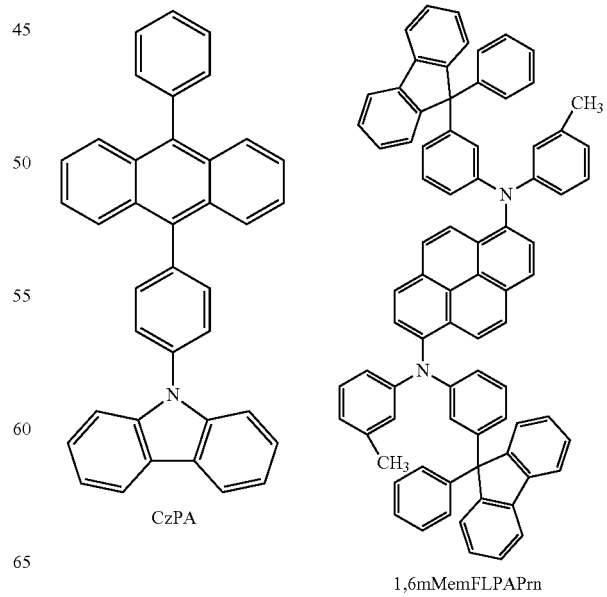

CzPA 1,6mMemFLPAPrn

-continued
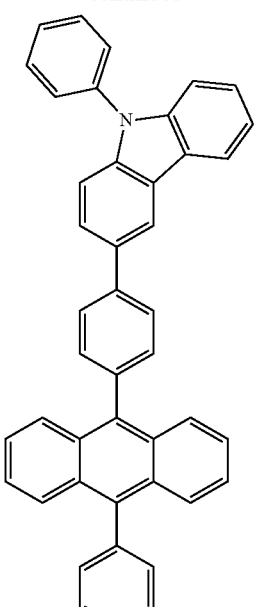
PCzPA
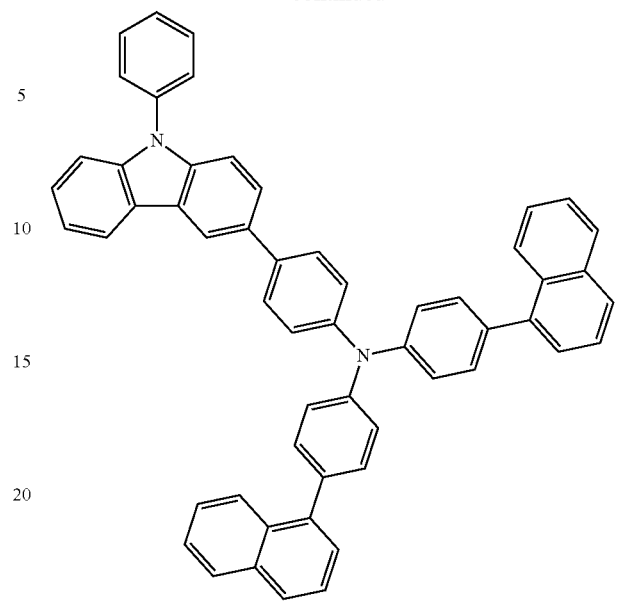
PCBNBB
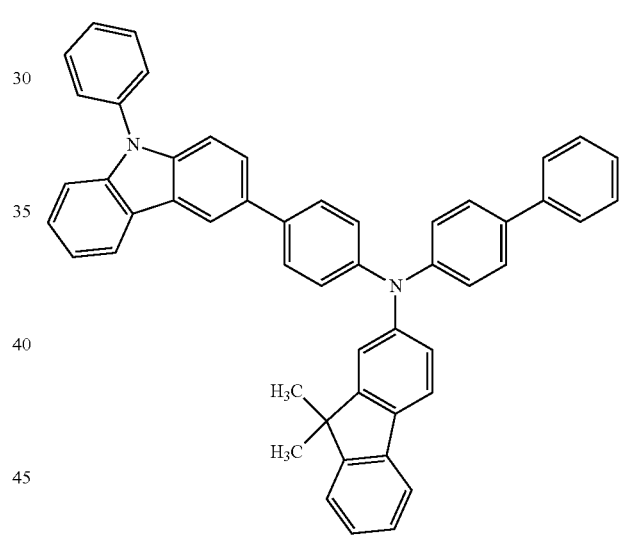
PCBBiF
2mDBTBPDBq-II
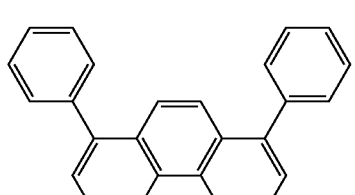
BPhen
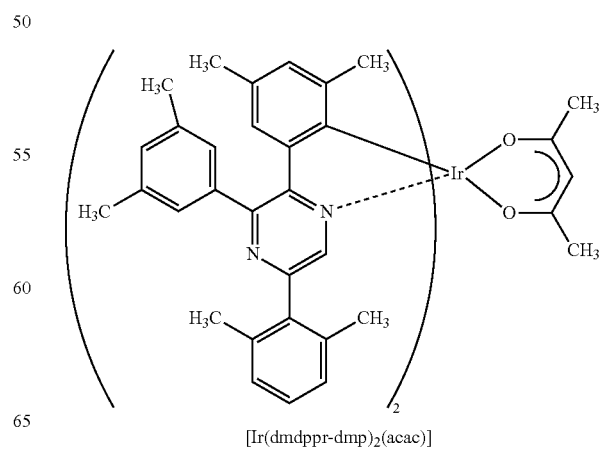
[Ir(dmdppr-dmp)$_2$(acac)]

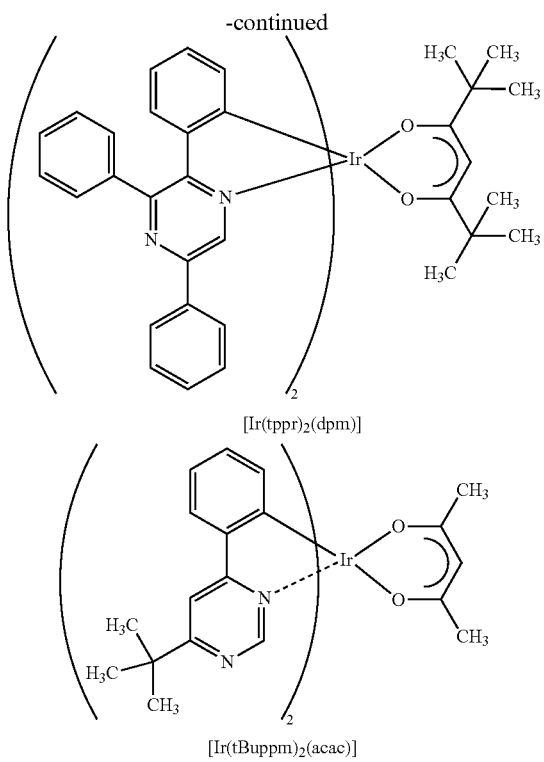

[Ir(tppr)₂(dpm)]

[Ir(tBuppm)₂(acac)]

<<Fabrication of Light-Emitting Elements 1 and 2, and Comparative Light-Emitting Elements 3 and 4>>

Figure 7:
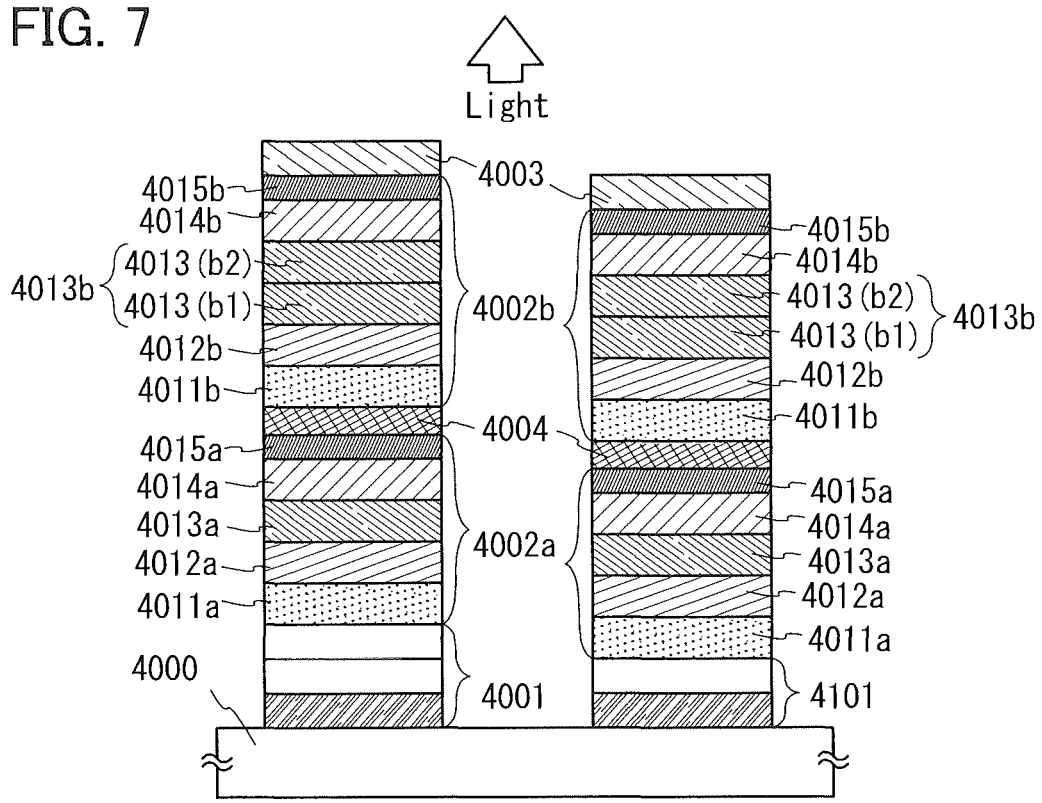
FIG. 7 illustrates structures of a light-emitting element 1, a light-emitting element 2, a comparative light-emitting element 3, and a comparative light-emitting element 4.

In this example, the light-emitting element 1 and the comparative light-emitting element 3 which emit red light are shown on the left of FIG. 7, and the light-emitting element 2 and the comparative light-emitting element 4 which emit green light are shown on the right of FIG. 7. Note that all these light-emitting elements have a structure in which light is emitted from the second electrode 4003 side.

In the light-emitting elements 1 and 2, the same material is used for a light-emitting layer (4013(*b2*)) in a second EL layer 4002*b*. Also, the material for the light-emitting layer (4013(*b2*)) in the second EL layer 4002*b* is the same in the comparative light-emitting elements 3 and 4, but is different from the material used in the light-emitting elements 1 and 2. The light-emitting element 1 and the comparative light-emitting element 3 shown on the left of FIG. 7 are optically adjusted so that red light emission is obtained. The light-emitting element 2 and the comparative light-emitting element 4 shown on the right of FIG. 7 are optically adjusted so that green light emission is obtained. Therefore, a first electrode 4001 on the left of FIG. 7 has a structure different from that of a first electrode 4101 on the right of FIG. 7. Note that other common components are denoted by the same reference numerals in FIG. 7.

For the light-emitting elements 1 and 2, first, an alloy film of aluminum (Al), nickel (Ni), and lanthanum (La) (Al—Ni—La alloy film) with a thickness of 200 nm was deposited over a glass substrate 4000 by a sputtering method, a film of Ti with a thickness of 6 nm was deposited by a sputtering method, and then a film of indium tin oxide containing silicon oxide (ITSO) was deposited by a sputtering method. For the comparative light-emitting elements 3 and 4, an alloy film of aluminum (Al) and titanium (Ti) (Al—Ti alloy film) with a thickness of 200 nm was deposited over the glass substrate 4000 by a sputtering method, a film of Ti with a thickness of 6 nm was deposited by a sputtering method, and then a film of indium tin oxide containing silicon oxide (ITSO) was deposited by a sputtering method. In that case, the thickness of the ITSO film was 75 nm in the light-emitting element 1, 40 nm in the light-emitting element 2, 80 nm in the comparative light-emitting element 3, and 40 nm in the comparative light-emitting element 4. Thus, the first electrodes 4001 and 4101 serving as anodes of the light-emitting elements 1 and 2 and the comparative light-emitting elements 3 and 4 were formed. At this time, the films of Ti are partially or entirely oxidized and contain titanium oxide. Note that the electrode area was 2 mm×2 mm.

Then, as pretreatment for forming the light-emitting elements 1 and 2 and the comparative light-emitting elements 3 and 4 over the substrate 4000, UV ozone treatment was performed for 370 seconds after washing of a surface of the substrate with water and 1-hour baking at 200° C.

After that, the substrate was transferred into a vacuum evaporation apparatus where the pressure had been reduced to approximately $10^{-4}$ Pa, and was subjected to vacuum baking at 170° C. for 60 minutes in a heating chamber of the vacuum evaporation apparatus, and then the substrate 4000 was cooled down for about 30 minutes.

Next, the substrate 4000 was fixed to a holder provided in the vacuum evaporation apparatus so that a surface of the substrate 4000 provided with the first electrodes (4001 and 4101) was directed downward. In this example, by a vacuum evaporation method, a first hole-injection layer 4011*a*, a first hole-transport layer 4012*a*, a light-emitting layer (A) (4013*a*), a first electron-transport layer 4014*a*, and a first electron-injection layer 4015*a*, which are included in a first EL layer 4002*a*, were sequentially formed, and then a charge-generation layer 4004 was formed. After that, a second hole-injection layer 4011*b*, a second hole-transport layer 4012*b*, a light-emitting layer (B) (4013(*b1*) and 4013(*b2*)), a second electron-transport layer 4014*b*, and a second electron-injection layer 4015*b*, which are included in a second EL layer 4002*b*, were sequentially formed.

The pressure in the vacuum evaporation apparatus was reduced to $10^{-4}$ Pa. Then, for the light-emitting elements 1 and 2, 9-[4-(9-phenyl-9H-carbazol-3-yl)phenyl] phenanthrene (abbreviation: PcPPn) and molybdenum oxide were co-evaporated at a mass ratio of 1:0.5 (PcPPn: molybdenum oxide), whereby the first hole-injection layer 4011*a* was formed over the first electrodes (4001 and 4101). Note that the thickness of the first hole-injection layer 4011*a* was 10 nm in each of the light-emitting elements 1 and 2. For the comparative light-emitting elements 3 and 4, the first hole-injection layer 4011*a* was formed by co-evaporation of 9-phenyl-3-[4-(10-phenyl-9-anthryl)phenyl]-9H-carbazole (abbreviation: PCzPA), and molybdenum oxide at a mass ratio of 1:0.5. Note that the thickness of the first hole-injection layer 4011*a* was 10 nm in the comparative light-emitting element 3 and 13 nm in the comparative light-emitting element 4.

Then, the first hole-transport layer 4012*a* was formed by evaporation of PcPPn (abbreviation). The thickness of the first hole-transport layer 4012*a* was 15 nm in each of the light-emitting elements 1 and 2, and 20 nm in each of the comparative light-emitting elements 3 and 4.

Next, a light-emitting layer (A) 4013*a* was formed over the first hole-transport layer 4012*a*. The light-emitting layer (A) 4013*a* was formed by co-evaporation of 9-[4-(10-phenyl-9-anthracenyl)phenyl]-9H-carbazole (abbreviation: CzPA) and N,N'-bis(3-methylphenye-N,N'-bis[3-(9-phenyl-9H-fluoren-9-yl)phenyl]-pyrene-1,6-diamine (abbreviation: 1,6mMemFLPAPrn) at a mass ratio of 1:0.05 (CzPA:

1,6mMemFLPAPm). The thickness of the light-emitting layer (A) 4013a was 25 nm in each of the light-emitting elements 1 and 2, and 30 nm in each of the comparative light-emitting elements 3 and 4.

After that, the first electron-transport layer 4014a was formed over the light-emitting layer (A) 4013a by evaporation of a 5-nm-thick film of CzPA (abbreviation) and then evaporation of a 15-nm-thick film of bathophenanthroline (abbreviation: BPhen). In addition, the first electron-injection layer 4015a was formed by evaporation of a 0.1-nm thick film of lithium oxide ($Li_2O$) over the first electron-transport layer 4014a.

Then, the charge-generation layer 4004 was formed over the first electron-injection layer 4015a by evaporation of a 2-nm-thick film of copper phthalocyanine (abbreviation: CuPc).

Next, for the light-emitting elements 1 and 2, 1,3,5-tri (dibenzothiophen-4-yl)benzene (abbreviation: DBT3P-II) and molybdenum oxide were co-evaporated at a mass ratio of 1:0.5 (DBT3P-II: molybdenum oxide), whereby the second hole-injection layer 4011b with a thickness of 12.5 nm was formed over the charge-generation layer 4004. For the comparative light-emitting elements 3 and 4, 9-phenyl-3-[4-(10-phenyl-9-anthryl)phenyl]-9H-carbazole (abbreviation: PCzPA) and molybdenum oxide were co-evaporated at a mass ratio of 1:0.5 (PCzPA: molybdenum oxide), whereby the second hole-injection layer 4011b with a thickness of 13 nm was formed.

Then, the second hole-transport layer 4012b was formed by evaporation of a 20-nm-thick film of 4-phenyl-4'-(9-phenylfluoren-9-yl)triphenylamine (abbreviation: BPAFLP).

After that, the light-emitting layer (B) (a first light-emitting layer 4013(b1) and a second light-emitting layer 4013(b2)) was formed over the second hole-transport layer 4012b.

For the light-emitting elements 1 and 2, the first light-emitting layer 4013(b1) was formed to a thickness of 20 nm by co-evaporation of 2-[3'-(dibenzothiophen-4-yl)biphenyl-3-yl]dibenzo[f,h]quinoxaline (abbreviation: 2mDBTBPDBq-II), N-(1,1'-biphenyl-4-yl)-N-[4-(9-phenyl-9H-carbazol-3-yl)phenyl]-9,9-dimethyl-9H-fluoren-2-amine (abbreviation: PCBBiF), and (acetylacetonato)bis(6-tert-butyl-4-phenylpyrimidinato)iridium(III) (abbreviation: [Ir(tBuppm)2(acac)]) at a mass ratio of 0.8:0.2:0.06 (2mDBTBPDBq-II: PCBBiF: [Ir(tBuppm)2(acac)]). For the comparative light-emitting elements 3 and 4, the first light-emitting layer 4013(b1) was formed to a thickness of 20 nm by co-evaporation of 2-[3'-(dibenzothiophen-4-yl)biphenyl-3-yl]dibenzo[f,h]quinoxaline (abbreviation: 2mDBTBPDBq-II), 4,4'-di(1-naphthyl)-4"-(9-phenyl-9H-carbazol-3-yl)triphenylamine (abbreviation: PCBNBB), and (acetylacetonato)bis(6-tert-butyl-4-phenylpyrimidinato) iridium(III) (abbreviation: [Ir(tBuppm)$_2$(acac)]) at a mass ratio of 0.8:0.2:0.06 (2mDBTBPDBq-II: PCBNBB: [ft (tBuppm)$_2$(acac)]).

For the light-emitting elements 1 and 2, the second light-emitting layer 4013(b2) was formed to a thickness of 20 nm by co-evaporation of 2mDBTBPDBq-II (abbreviation) and bis{4,6-dimethyl-2-[5-(2,6-dimethylphenyl)-3-(3,5-dimethylphenyl)-2-pyrazinyl-κN]phenyl-κC}(2,4-pentanedionato-κk$^2$O,O')iridium(III) (abbreviation: [Ir(dmdppr-dmp)$_2$ (acac)]) at a mass ratio of 1:0.06 (2mDBTBPDBq-II: [Ir(dmdppr-dmp)$_2$(acac)]). For the comparative light-emitting elements 3 and 4, the second light-emitting layer 4013(b2) was formed to a thickness of 20 nm by co-evaporation of 2mDBTBPDBq-II and bis(2,3,5-triphenylpyrazinato)(dipivaloylmethanato)iridium (III) (abbreviation: [Ir(tppr)$_2$(dpm)]at a mass ratio of 1:0.06 (2mDBTBPDBq-II: [Ir(tppr)$_2$(dpm)]).

Next, the second electron-transport layer 4014b was formed over the light-emitting layer (B) 4013b.

For the light-emitting elements 1 and 2, the second electron-transport layer 4014b was formed by evaporation of a 35-nm-thick film of 2mDBTBPDBq-II (abbreviation) and then evaporation of a 15-nm-thick film of BPhen (abbreviation). For the comparative light-emitting elements 3 and 4, the second electron-transport layer 4014b was formed by evaporation of a 15-nm-thick film of 2mDBTBPDBq-II (abbreviation) and then evaporation of a 15-nm-thick film of BPhen (abbreviation).

Furthermore, the second electron-injection layer 4015b was formed over the second electron-transport layer 4014b by evaporation of a 1-nm-thick film of lithium fluoride (LiF).

Finally, the second electrode 4003 serving as a cathode was formed over the second electron-injection layer 4015b. The second electrode 4003 was obtained by forming a 15-nm-thick film of silver (Ag) and magnesium (Mg) by co-evaporation at a mass ratio of 1:0.1, and then forming a 70-nm-thick film of indium tin oxide (ITO) by a sputtering method. Note that in all the above evaporation steps, evaporation was performed by a resistance heating method.

Table 1 shows the structures of the light-emitting elements 1 and 2 and the comparative light-emitting elements 3 and 4 obtained through the above steps.

TABLE 1

| Numerals in FIG. 7 | First electrode 4001, 4101 | | First hole-injection layer 4011a | First hole-transport layer 4012a | Light-emitting layer (A) 4013a | First electron-transport layer 4014a | |
|---|---|---|---|---|---|---|---|
| Light-emitting element 1 (R) | Al—Ni—La\Ti (200 nm\6 nm) | ITSO (75 nm) | PCPPn:MoOx (1:0.5 10 nm) | PCPPn (15 nm) | *1 | CzPA (5 nm) | BPhen (15 nm) |
| Light-emitting element 2 (G) | | ITSO (40 nm) | PCPPn:MoOx (1:0.5 10 nm) | | | | |
| Comparative light-emitting element 3 (R) | Al—Ti\Ti (200 nm\6 nm) | ITSO (80 nm) | PCzPA:MoOx (1:0.5 10 nm) | PCPPn (20 nm) | *2 | | |
| Comparative light-emitting element 4 (G) | | ITSO (40 nm) | PCzPA:MoOx (1:0.5 13 nm) | | | | |

TABLE 1-continued

| First electron-injection layer 4015a | Charge generation layer 4004 | Second hole-injection layer 4011b | Second hole-transport layer 4012b | Light-emitting layer (B) First light-emitting layer 4013 (b1) | Light-emitting layer (B) Second light-emitting layer 4013 (b2) | (Remarks) |
|---|---|---|---|---|---|---|
| Li$_2$O (0.1 nm) | CuPc (2 nm) | DBT3P-II:MoOx (1:0.5 12.5 nm) | BPAFLP (20 nm) | *3 | *5 | Light-emitting element 1 (R) |
|  |  |  |  |  |  | Light-emitting element 2 (G) |
|  |  | PCzPA:MoOx (1:0.5 13 nm) |  | *4 | *6 | Comparative light-emitting element 3 (R) |
|  |  |  |  |  |  | Comparative light-emitting element 4 (G) |

| Second electron-transport layer 4014b | | Second electron-injection layer 4015b | Second electrode 4003 | | CF | | |
|---|---|---|---|---|---|---|---|
| 2mDBTBPDBq-II (35 nm) | BPhen (15 nm) | LiF (1 nm) | Ag:Mg (1:0.1 15 nm) | ITO (70 nm) | R (2.36 μm) | | Light-emitting element 1 (R) |
|  |  |  |  |  | G (1.29 μm) | | Light-emitting element 2 (G) |
| 2mDBTBPDBq-II (15 nm) |  |  |  |  | R (2.36 μm) | | Comparative light-emitting element 3 (R) |
|  |  |  |  |  | G (1.29 μm) | | Comparative light-emitting element 4 (G) |

*1 CzPA:1,6mMemFLPAPrn (1:0.05 25 nm)
*2 CzPA:1,6mMemFLPAPrn (1:0.05 30 nm)
*3 2mDBTBPDBq-II:PCBBiF:[Ir(tBuppm)$_2$(acac)] (0.8:0.2:0.06 20 nm)
*4 2mDBTBPDBq-II:PCBNBB:[Ir(tBuppm)$_2$(acac)] (0.8:0.2:0.06 20 nm)
*5 2mDBTBPDBq-II:[Ir(dmdppr-dmp)$_2$(acac)] (1:0.06 20 nm)
*6 2mDBTBPDBq-II:[Ir(tppr)$_2$(dpm)] (1:0.06 20 nm)

As shown in Table 1, a red coloring layer (R) is formed on a counter substrate of each of the light-emitting element 1 and the comparative light-emitting element 3, and a green coloring layer (G) is formed on a counter substrate of the light-emitting element 2 and the comparative light-emitting element 4. The fabricated light-emitting elements 1 and 2 and comparative light-emitting elements 3 and 4 were sealed by being bonded to these counter substrates in a glove box containing a nitrogen atmosphere so as not to be exposed to the air (specifically, a sealant was applied on the outer edge of the element, and irradiation with ultraviolet light with a wavelength of 365 nm at 6 J/cm$^2$ and heat treatment at 80° C. for 1 hour were performed for sealing).

<<Operation Characteristics of Light-emitting Elements 1 and 2 and Comparative Light-emitting Elements 3 and 4>>

The operation characteristics of the fabricated light-emitting elements 1 and 2 and comparative light-emitting elements 3 and 4 were measured. Note that the measurement was carried out at room temperature (under an atmosphere in which the temperature was kept at 25° C.).

Figure 8:
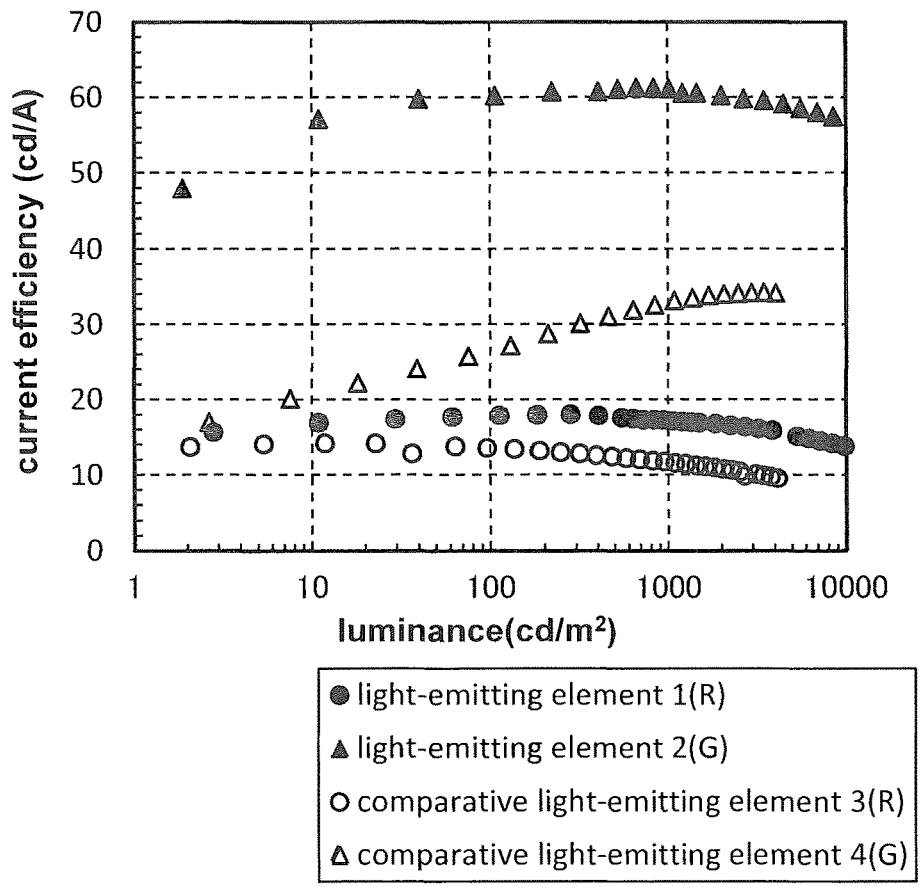
FIG. 8 shows luminance-current efficiency characteristics of the light-emitting element 1, the light-emitting element 2, the comparative light-emitting element 3, and the comparative light-emitting element 4.

First, FIG. 8 shows the luminance-current efficiency characteristics of the light-emitting elements 1 and 2 and the comparative light-emitting elements 3 and 4. In FIG. 8, the vertical axis represents current efficiency (cd/A) and the horizontal axis represents luminance (cd/m$^2$).

Table 2 shows the initial values of the main characteristics of the light-emitting elements 1 and 2 and the comparative light-emitting elements 3 and 4 at a luminance of approximately 1000 cd/m$^2$.

TABLE 2

|  | Voltage (V) | Current (mA) | Current density (mA/cm$^2$) | Chromaticity (x, y) | Luminance (cd/m$^2$) | Current efficiency (cd/A) | Power efficiency (lm/W) |
|---|---|---|---|---|---|---|---|
| Light-emitting element 1 (R) | 7.2 | 0.2 | 5.5 | (0.67, 0.33) | 950 | 17 | 7.5 |
| Light-emitting element 2 (G) | 6.4 | 0.067 | 1.7 | (0.27, 0.71) | 1000 | 61 | 30 |
| Comparative light-emitting element 3 (R) | 6.7 | 0.3 | 8.1 | (0.67, 0.33) | 950 | 12 | 5.5 |
| Comparative light-emitting element 4 (G) | 6.2 | 0.13 | 3.3 | (0.26, 0.72) | 1100 | 33 | 17 |

The above results are summarized as follows. The light-emitting element 1 and the comparative light-emitting element 3 fabricated in this example use different materials for the second light-emitting layer 4013(*b*2) in the light-emitting layer (B) (4013*b*), though both of the elements 1 and 3 emit red (R) light. Specifically, in the light-emitting element 1, a host material is 2mDBTBPDBq-II and a guest material is [Ir(dmdppr-dmp)$_2$(acac)]. In contrast, in the comparative light-emitting element 3, a host material is the same as that in the light-emitting element 1, but a guest material is [Ir(tppr)$_2$(dpm)]. Note that as the result of cyclic voltammetry (CV) measurement, the LUMO of the host material (2mDBTBPDBq-II) was −2.94 eV, the LUMO of the guest material ([Ir(dmdppr-dmp)$_2$(acac)]) in the light-emitting element 1 was −2.91 eV, and the LUMO of the guest material ([Ir(tppr)$_2$(dpm)]) in the comparative light-emitting element 3 was −3.05 eV. Thus, the LUMO level of the guest material is in the range of ±0.1 eV of the LUMO level of the host material in the case of the light-emitting element 1, while it is not in the range of ±0.1 eV in the case of the comparative light-emitting element 3. Such a difference in LUMO level probably causes a difference in the current efficiency characteristics between the light-emitting element 1 and the comparative light-emitting element 3.

In comparison between the light-emitting element 2 and the comparative light-emitting element 4, both of which emit green (G) light, the light-emitting element 2 exhibits higher current efficiency as shown in Table 2. Note that the light-emitting elements 1 and 2 include the same guest material exhibiting red emission in the second light-emitting layer 4013(b2) in the light-emitting layer (B) (4013b), and the same guest material exhibiting green emission in the first light-emitting layer 4013(b1). The reason why the current efficiency of the light-emitting element 2 is higher than that of the comparative light-emitting element 4 is probably as follows. The host material and the guest material used for the second light-emitting layer 4013(b2) have the aforementioned relationship of LUMO level, so that the current efficiency of the red-emitting element increases. This increases the recombination efficiency of carriers in the first light-emitting layer 4013(b1) stacked on the second light-emitting layer 4013(b2). Hence, the current efficiency of the green-emitting elements also increases.

As described above, when a red-emitting element and a green-emitting element are obtained by combining a coloring layer (color filter) with a white-emitting element, the current efficiency of not only the red-emitting element but also the green-emitting element is increased by changing only a red-emitting material, which could not contribute to green light emission. Such a phenomenon cannot be expected in general. In other words, this phenomenon is a significant effect of the structure of the present invention.

An appropriate combination of these light-emitting elements will therefore offer a full-color or white light-emitting device with a high current efficiency.

Figure 9:
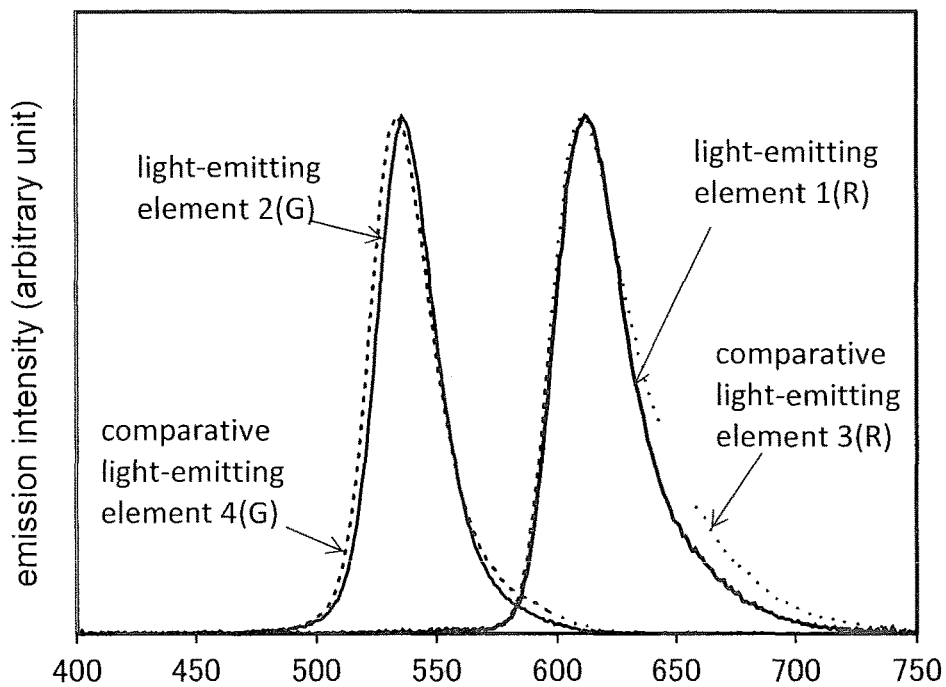
FIG. 9 shows emission spectra of the light-emitting element 1, the light-emitting element 2, the comparative light-emitting element 3, and the comparative light-emitting element 4.

FIG. 9 shows the emission spectra of the light-emitting elements 1 and 2 and the comparative light-emitting elements 3 and 4, through which a current flows at a current density of 2.5 mA/cm$^2$. As shown in FIG. 9, the emission spectra of the light-emitting element 1(R) and the comparative light-emitting element 3(R) have peaks at around 611 nm, and the emission spectra of the light-emitting element 2(G) and the comparative light-emitting element 4(G) have peaks at around 534 nm. The emission of each light-emitting element is derived from a phosphorescent organometallic iridium complex included in the light-emitting layer.

Note that in comparison between the light-emitting element 1 and the comparative light-emitting element 3, both of which emit red light, the spectrum of the light-emitting element 1 is narrower than that of the comparative light-emitting element 3; and in comparison between the light-emitting element 2 and the comparative light-emitting element 4, both of which emit green light, the spectrum of the light-emitting element 2 is narrower than that of the comparative light-emitting element 4. Such narrowing of the spectra also indicates that the current efficiency of the light-emitting elements 1 and 2 become higher than that of the comparative light-emitting elements 3 and 4.

EXPLANATION OF REFERENCE

101: anode, 102: cathode, 103: EL layer, 104: hole-injection layer, 105: hole-transport layer, 106: light-emitting layer, 106a: first light-emitting layer, 106b: second light-emitting layer, 107: electron-transport layer, 108: electron-injection layer, 109: guest material, 109a: first light-emitting material, 109b: second light-emitting material, 110: host material, 201: first electrode, 202(1): first EL layer, 202(2): second EL layer, 202(n-1): (n-1)th EL layer, 202(n): n-th EL layer, 204: second electrode, 205: charge-generation layer, 205(1): first charge-generation layer, 205(2): second charge-generation layer, 205(n-2): (n-2)th charge-generation layer, 205(n-1): (n-1)th charge-generation layer, 301: reflective electrode, 302: transflective electrode, 303a: first transparent conductive layer, 303b: second transparent conductive layer, 304P: first light-emitting layer, 304Q: second light-emitting layer, 305: EL layer, 310P: first light-emitting element, 310Q: second light-emitting element, 401: element substrate, 402: pixel portion, 403: driver circuit portion (source line driver circuit), 404a, 404b: driver circuit portion (gate line driver circuit), 405: sealant, 406: sealing substrate, 407: wiring, 408: FPC (flexible printed circuit), 409: FET, 410: FET, 411: switching FET, 412: current control FET, 413: first electrode (anode), 414: insulator, 415: EL layer, 416: second electrode (cathode), 417: light-emitting element, 418: space, 4000: substrate, 4001: electrode, 4101: electrode, 4002a: EL layer, 4002b: EL layer, 4003: electrode, 4004: charge-generation layer, 4011a: hole-injection layer, 4011b: hole-injection layer, 4012a: hole-transport layer, 4012b: hole-transport layer, 4013a: light-emitting layer (A), 4013b: light-emitting layer (B), 4013(b1): light-emitting layer (B); first light-emitting layer, 4013(b2): light-emitting layer (B); second light-emitting layer, 4014a: electron-transport layer, 4014b: electron-transport layer, 4015a: electron-injection layer, 4015b: electron-injection layer, 7100: television device, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7302: housing, 7304: display panel, 7305: icon indicating time, 7306: another icon, 7311: operation button, 7312: operation button, 7313: connection terminal, 7321: band, 7322: clasp, 7400: mobile phone, 7401: housing, 7402: display portion, 7403: button, 7404: external connection portion, 7405: speaker, 7406: microphone, 7407: camera, 7500(1), 7500(2): housing, 7501(1), 7501(2): first screen, 7502(1), 7502(2): second screen, 8001: lighting device, 8002: lighting device, 8003: lighting device, 8004: lighting device.

This application is based on Japanese Patent Application serial No. 2014-031792 filed with Japan Patent Office on Feb. 21, 2014, the entire contents of which are hereby incorporated by reference.

The invention claimed is:
1. A light-emitting element comprising:
a first EL layer between an anode and a cathode; and
a light-emitting layer between the anode and the cathode,
wherein the first EL layer includes a first light-emitting layer and a second light-emitting layer, wherein the first light-emitting layer is located between the cathode and the second light-emitting layer, wherein the first light-emitting layer is in contact with the second light-emitting layer, wherein the first light-emitting layer includes a first host material and a first guest material, wherein the second light-emitting layer includes a second host material and a second guest material, wherein an emission peak of the second guest material is at a shorter wavelength than an emission peak of the first guest material, wherein a lowest unoccupied molecular orbital level of the first guest material is in a range of higher than 0 eV and lower than 0.1 eV of a lowest unoccupied molecular orbital level of the first host material, wherein each of the first guest material and the second guest material is a phosphorescent organometallic iridium complex, and wherein the first guest material is different from the second guest material.

2. The light-emitting element according to claim 1, further comprising:
a second EL layer between the anode and the cathode; and
a charge-generation layer between the first EL layer and the second EL layer.

3. The light-emitting element according to claim 2, wherein the first EL layer is located between the charge-generation layer and the cathode.

4. The light-emitting element according to claim 2, wherein the first EL layer is located between the charge-generation layer and the anode.

5. The light-emitting element according to claim 1, further comprising a third light-emitting layer,
wherein the third light-emitting layer is located between the first light-emitting layer and the cathode,
wherein the third light-emitting layer is in contact with the first light-emitting layer, and
wherein the second light-emitting layer and the third light-emitting layer include the same material.

6. The light-emitting element according to claim 1,
wherein emission in the first light-emitting layer has a peak at a wavelength from 560 nm to 700 nm, and
wherein emission in the second light-emitting layer has a peak at a wavelength from 500 nm to 560 nm.

7. A light-emitting device comprising:
the light-emitting element according to claim 1; and
a flexible printed circuit.

8. An electronic device comprising:
the light-emitting device according to claim 7; and
an operation key, a speaker, a microphone, or an external connection portion.

9. A lighting device comprising:
the light-emitting device according to claim 7; and
a housing.

10. The light-emitting element according to claim 1, wherein the first guest material is an organometallic iridium complex in which a ligand is a phenylpyrazine derivative having an alkyl group.

11. The light-emitting element according to claim 1,
wherein the first guest material is an organometallic iridium complex in which a ligand is a phenylpyrazine derivative having an alkyl group, and
wherein the first host material is an electron-transport host material including a quinoxaline derivative.

12. The light-emitting element according to claim 1,
wherein the first guest material exhibits red emission, and
wherein the second guest material exhibits green emission.

13. A light-emitting element comprising:
a first EL layer between an anode and a cathode; and
a light-emitting layer between the anode and the cathode,
wherein the first EL layer includes a first light-emitting layer and a second light-emitting layer,
wherein the first light-emitting layer is located between the cathode and the second light-emitting layer,
wherein the first light-emitting layer is in contact with the second light-emitting layer,
wherein the first light-emitting layer includes an electron-transport material, and a hole-transport material, and a first guest material,
wherein the second light-emitting layer includes a host material and a second guest material,
wherein an emission peak of the second guest material is shorter than an emission peak of the first guest material,
wherein a lowest unoccupied molecular orbital level of the first guest material is in a range of higher than 0 eV and lower than 0.1 eV of a lowest unoccupied molecular orbital level of one of the electron-transport material and the hole-transport material,
wherein each of the first guest material and the second guest material is a phosphorescent organometallic iridium complex, and
wherein the first guest material is different from the second guest material.

14. The light-emitting element according to claim 13, further comprising:
a second EL layer between the anode and the cathode; and
a charge-generation layer between the first EL layer and the second EL layer.

15. The light-emitting element according to claim 14, wherein the first EL layer is located between the charge-generation layer and the cathode.

16. The light-emitting element according to claim 14, wherein the first EL layer is located between the charge-generation layer and the anode.

17. The light-emitting element according to claim 13, further comprising a third light-emitting layer,
wherein the third light-emitting layer is located between the first light-emitting layer and the cathode,
wherein the third light-emitting layer is in contact with the first light-emitting layer, and
wherein the second light-emitting layer and the third light-emitting layer include the same material.

18. The light-emitting element according to claim 13,
wherein emission in the first light-emitting layer has a peak at a wavelength from 560 nm to 700 nm, and
wherein emission in the second light-emitting layer has a peak at a wavelength from 500 nm to 560 nm.

19. A light-emitting device comprising:
the light-emitting element according to claim 13; and
a flexible printed circuit.

20. An electronic device comprising:
the light-emitting device according to claim 19; and
an operation key, a speaker, a microphone, or an external connection portion.

21. A lighting device comprising:
the light-emitting device according to claim 19; and
a housing.

22. The light-emitting element according to claim 13, wherein the first guest material is an organometallic iridium complex in which a ligand is a phenylpyrazine derivative having an alkyl group.

23. The light-emitting element according to claim 13,
wherein the first guest material is an organometallic iridium complex in which a ligand is a phenylpyrazine derivative having an alkyl group, and
wherein the electron-transport material includes a quinoxaline derivative.

24. The light-emitting element according to claim 13,
wherein the first guest material exhibits red emission, and
wherein the second guest material exhibits green emission.

* * * * *